United States Patent
Siau

(10) Patent No.: US 8,565,003 B2
(45) Date of Patent: Oct. 22, 2013

(54) MULTILAYER CROSS-POINT MEMORY ARRAY HAVING REDUCED DISTURB SUSCEPTIBILITY

(75) Inventor: Chang Hua Siau, Saratoga, CA (US)

(73) Assignee: Unity Semiconductor Corporation, Sunnyvale, CA (US)

( * ) Notice: Subject to any disclaimer, the term of this patent is extended or adjusted under 35 U.S.C. 154(b) by 162 days.

(21) Appl. No.: 13/171,350

(22) Filed: Jun. 28, 2011

(65) Prior Publication Data
US 2013/0003437 A1    Jan. 3, 2013

(51) Int. Cl.
*G11C 11/00*    (2006.01)

(52) U.S. Cl.
USPC ......... 365/148; 365/63; 365/158; 365/189.08

(58) Field of Classification Search
USPC .............................. 365/148, 63, 158, 189.08
See application file for complete search history.

(56) References Cited

U.S. PATENT DOCUMENTS

| | | | |
|---|---|---|---|
| 5,483,482 A | 1/1996 | Yamada et al. |
| 5,991,193 A | 11/1999 | Gallagher et al. |
| 6,034,882 A | 3/2000 | Johnson et al. |
| 6,128,214 A | 10/2000 | Kuekes et al. |
| 6,185,122 B1 | 2/2001 | Johnson et al. |
| 6,204,139 B1 | 3/2001 | Liu et al. |
| 6,351,406 B1 | 2/2002 | Johnson et al. |
| 6,385,074 B1 | 5/2002 | Johnson et al. |
| 6,407,953 B1 | 6/2002 | Cleeves |
| 6,420,215 B1 | 7/2002 | Knall et al. |
| 6,459,095 B1 | 10/2002 | Heath et al. |
| 6,473,332 B1 | 10/2002 | Ignatiev et al. |
| 6,504,753 B1 | 1/2003 | Scheuerlein et al. |
| 6,515,888 B2 | 2/2003 | Johnson et al. |
| 6,515,904 B2 | 2/2003 | Moore et al. |
| 6,522,594 B1 | 2/2003 | Scheuerlein |
| 6,525,953 B1 | 2/2003 | Johnson |
| 6,534,403 B2 | 3/2003 | Cleeves |
| 6,545,891 B1 | 4/2003 | Tringali et al. |
| 6,569,745 B2 | 5/2003 | Hsu |
| 6,599,796 B2 | 7/2003 | Mei et al. |
| 6,631,085 B2 | 10/2003 | Kleveland et al. |
| 6,642,539 B2 | 11/2003 | Ramesh et al. |
| 6,693,821 B2 | 2/2004 | Hsu et al. |
| 6,759,249 B2 | 7/2004 | Zhuang et al. |

(Continued)

OTHER PUBLICATIONS

U.S. Appl. No. 12/653,854, filed Dec. 18, 2009, Bornstein et al.

(Continued)

*Primary Examiner* — Viet Q Nguyen
(74) *Attorney, Agent, or Firm* — Stolowitz Ford Cowger LLP

(57) ABSTRACT

A multi-layer cross-point memory array comprises one or more word line (WL) layers, one or more bit line (BL) layers interleaved with the one or more WL layers, and a plurality of memory layers, each memory layer disposed between an adjacent WL layer and an adjacent BL layer, and each memory layer including memory elements configured between cross-points of WLs and BLs of the adjacent WL and BL layers. Memory elements in successive memory layers of the memory array are configured with opposing orientations, so that half-selected memory elements arising during times when data operations are being performed on selected memory elements in the memory array are subjected to stress voltages of a polarity of which they are least susceptible to being disturbed. The memory elements can be discrete re-writeable non-volatile two-terminal memory elements that are fabricated as part of a BEOL fabrication process used to fabricate the memory array.

34 Claims, 18 Drawing Sheets

(56) References Cited

U.S. PATENT DOCUMENTS

| | | | |
|---|---|---|---|
| 6,777,248 B1 | 8/2004 | Nabatame et al. | |
| 6,816,410 B2 | 11/2004 | Kleveland et al. | |
| 6,822,903 B2 | 11/2004 | Scheuerlein et al. | |
| 6,836,421 B2 | 12/2004 | Rinerson et al. | |
| 6,850,455 B2 | 2/2005 | Rinerson et al. | |
| 6,859,382 B2 | 2/2005 | Rinerson et al. | |
| 6,882,553 B2 | 4/2005 | Nejad et al. | |
| 6,917,539 B2 | 7/2005 | Rinerson et al. | |
| 6,927,430 B2 | 8/2005 | Hsu | |
| 6,940,113 B2 | 9/2005 | Hsu et al. | |
| 6,940,744 B2 | 9/2005 | Rinerson et al. | |
| 6,970,375 B2 | 11/2005 | Rinerson et al. | |
| 7,001,846 B2 | 2/2006 | Hsu | |
| 7,009,909 B2 | 3/2006 | Rinerson et al. | |
| 7,020,006 B2 | 3/2006 | Chevallier et al. | |
| 7,022,572 B2 | 4/2006 | Scheuerlein et al. | |
| 7,023,743 B2 | 4/2006 | Nejad et al. | |
| 7,046,550 B1 | 5/2006 | Reohr et al. | |
| 7,057,914 B2 | 6/2006 | Rinerson et al. | |
| 7,067,862 B2 * | 6/2006 | Rinerson et al. | 257/295 |
| 7,079,442 B2 | 7/2006 | Rinerson et al. | |
| 7,141,481 B2 | 11/2006 | Hsu et al. | |
| 7,177,181 B1 | 2/2007 | Scheuerlein | |
| 7,256,415 B2 | 8/2007 | Furukawa et al. | |
| 7,326,979 B2 | 2/2008 | Rinerson et al. | |
| 7,339,811 B2 | 3/2008 | Nejad et al. | |
| 7,372,753 B1 | 5/2008 | Rinerson et al. | |
| 7,379,364 B2 | 5/2008 | Siau et al. | |
| 7,394,680 B2 | 7/2008 | Toda et al. | |
| 7,405,960 B2 | 7/2008 | Cho et al. | |
| 7,408,212 B1 * | 8/2008 | Luan et al. | 257/295 |
| 7,417,271 B2 | 8/2008 | Genrikh et al. | |
| 7,443,711 B1 | 10/2008 | Stewart et al. | |
| 7,463,546 B2 | 12/2008 | Fasoli et al. | |
| 7,498,600 B2 | 3/2009 | Cho et al. | |
| 7,505,344 B2 | 3/2009 | Scheuerlein | |
| 7,508,695 B2 | 3/2009 | Sugita | |
| 7,538,338 B2 * | 5/2009 | Rinerson et al. | 257/4 |
| 7,608,467 B2 | 10/2009 | Wu et al. | |
| 7,639,521 B2 | 12/2009 | Baek et al. | |
| 7,643,344 B2 | 1/2010 | Choi | |
| 7,701,791 B2 | 4/2010 | Rinerson et al. | |
| 7,706,177 B2 | 4/2010 | Petti | |
| 7,719,876 B2 | 5/2010 | Chevallier et al. | |
| 7,733,685 B2 | 6/2010 | Scheuerlein et al. | |
| 7,742,323 B2 | 6/2010 | Rinerson et al. | |
| 7,764,160 B2 | 7/2010 | Kawano et al. | |
| 7,782,650 B2 | 8/2010 | Bertin et al. | |
| 7,796,416 B2 | 9/2010 | Ishihara et al. | |
| 7,842,991 B2 | 11/2010 | Cho et al. | |
| 7,884,349 B2 | 2/2011 | Rinerson et al. | |
| 7,898,841 B2 | 3/2011 | Chevallier et al. | |
| 7,902,867 B2 | 3/2011 | Mouttet | |
| 7,902,868 B2 | 3/2011 | Norman | |
| 7,902,869 B1 | 3/2011 | Carter | |
| 7,920,408 B2 * | 4/2011 | Azuma et al. | 365/148 |
| 7,924,608 B2 | 4/2011 | Campbell | |
| 7,929,345 B2 | 4/2011 | Issaq | |
| 7,955,871 B2 | 6/2011 | Wu et al. | |
| 7,961,494 B2 | 6/2011 | Scheuerlein | |
| 7,982,504 B1 * | 7/2011 | Robinett | 326/103 |
| 7,985,963 B2 | 7/2011 | Rinerson et al. | |
| 7,990,753 B2 * | 8/2011 | Matsuo | 365/148 |
| 7,990,754 B2 | 8/2011 | Azuma et al. | |
| 7,999,307 B2 | 8/2011 | Kim et al. | |
| 8,031,509 B2 | 10/2011 | Schloss et al. | |
| 8,044,456 B2 * | 10/2011 | Nagashima et al. | 257/326 |
| 8,169,053 B2 * | 5/2012 | Kim et al. | 257/537 |
| 8,198,618 B2 * | 6/2012 | Mikawa et al. | 257/2 |
| 8,207,613 B2 * | 6/2012 | Okukawa et al. | 257/773 |
| 8,237,145 B2 * | 8/2012 | Kamata et al. | 257/3 |
| 2001/0055838 A1 | 12/2001 | Walker et al. | |
| 2003/0003675 A1 | 1/2003 | Hsu | |
| 2004/0109353 A1 | 6/2004 | Matsuoka | |
| 2004/0170040 A1 | 9/2004 | Rinerson et al. | |
| 2006/0054937 A1 | 3/2006 | Lucovsky et al. | |
| 2006/0131695 A1 | 6/2006 | Kuekes et al. | |
| 2006/0171200 A1 | 8/2006 | Rinerson et al. | |
| 2007/0132049 A1 | 6/2007 | Stipe | 257/421 |
| 2008/0068875 A1 | 3/2008 | Choi | |
| 2008/0090401 A1 | 4/2008 | Bratkovski et al. | |
| 2008/0157127 A1 | 7/2008 | Bertin et al. | |
| 2008/0278989 A1 | 11/2008 | Lee et al. | |
| 2009/0027976 A1 | 1/2009 | Brewer et al. | |
| 2009/0122598 A1 | 5/2009 | Toda et al. | 365/158 |
| 2009/0154232 A1 | 6/2009 | Norman | |
| 2009/0225582 A1 | 9/2009 | Schloss | |
| 2009/0302315 A1 | 12/2009 | Lee et al. | |
| 2010/0044666 A1 | 2/2010 | Baek et al. | |
| 2010/0067279 A1 | 3/2010 | Choi | |
| 2010/0073990 A1 | 3/2010 | Siau et al. | |
| 2010/0078759 A1 | 4/2010 | Sekar et al. | |
| 2010/0110771 A1 | 5/2010 | Choi | |
| 2010/0134239 A1 | 6/2010 | Wu et al. | |
| 2010/0155686 A1 | 6/2010 | Bratkovski et al. | |
| 2010/0155722 A1 | 6/2010 | Meyer | |
| 2010/0155953 A1 | 6/2010 | Bornstein | |
| 2010/0157658 A1 | 6/2010 | Schloss et al. | |
| 2010/0159641 A1 | 6/2010 | Rinerson et al. | |
| 2010/0159688 A1 | 6/2010 | Rinerson et al. | |
| 2010/0161888 A1 | 6/2010 | Eggleston | |
| 2010/0195393 A1 | 8/2010 | Eggleston | |
| 2010/0202188 A1 | 8/2010 | Rinerson et al. | |
| 2010/0271885 A1 | 10/2010 | Scheuerlein et al. | |
| 2010/0278479 A1 | 11/2010 | Bratkovski et al. | |
| 2010/0290294 A1 | 11/2010 | Siau | |
| 2011/0017977 A1 | 1/2011 | Bratkovski et al. | |
| 2011/0024710 A1 | 2/2011 | Bratkovski et al. | |
| 2011/0024716 A1 | 2/2011 | Bratkovski et al. | |
| 2011/0059576 A1 | 3/2011 | Cho et al. | |
| 2011/0220860 A1 | 9/2011 | Kim et al. | |
| 2011/0266538 A1 | 11/2011 | Lee et al. | |
| 2011/0297927 A1 | 12/2011 | Ramaswamy et al. | |
| 2012/0211716 A1 * | 8/2012 | Meyer | 257/2 |
| 2012/0314468 A1 * | 12/2012 | Siau et al. | 365/66 |

OTHER PUBLICATIONS

U.S. Appl. No. 12/653,835, filed Dec. 18, 2009, Meyer.
U.S. Appl. No. 13/210,342, filed Aug. 15, 2011, Brewer et al.
I.G. Baek et al., "Realization of Vertical Resistive Memory (VRRAM) Using Cost Effective 3D Processes", Samsung Electronics Co., Ltd., IEDM 2011, 31.8.1, pp. 737-740.
U.S. Appl. No. 12/931,422, filed Jan. 31, 2011, Chevallier et al.
U.S. Appl. No. 12/931,438, filed Feb. 1, 2011, Chevallier et al.
U.S. Appl. No. 12/657,895, filed Jan. 29, 2010, Chevallier et al.
U.S. Appl. No. 12/657,911, filed Jan. 29, 2010, Chang Hua Siau.
U.S. Appl. No. 12/658,138, filed Feb. 2, 2010, Chevallier et al.
U.S. Appl. No. 13/134,589, filed Jun. 10, 2011, Change Siau.
U.S. Appl. No. 13/134,579, filed Jun. 10, 2001, Siau et al.
U.S. Appl. No. 13/134,579, filed Jun. 10, 2011, Chang Hua Siau et al.
U.S. Appl. No. 13/185,410, filed Jul. 18, 2011, Besser et al.
U.S. Appl. No. 13/210,292, filed Aug. 15, 2011, Bruce Bateman.
U.S. Appl. No. 13/250,923, filed Sep. 30, 2011, Jian Wu et al.
U.S. Appl. No. 13/250,772, filed Sep. 30, 2011, Louis Parrillo et al.
Elaine Ou et al., "Array Architecture for a Nonvolatile 3-Dimensional Cross-Point Resistance-Change Memory", IEEE Journal of Solid-State Circuits, vol. 46, No. 9, Sep. 2011, pp. 2158-2170.
Elaine Ou et al., "Array Architecture for a Nonvolatile 3-Dimensional Cross-Point Memory", Doctoral Dissertation, Stanford University, Mar. 2010, pp. 1-119.
Leon Abelmann et al., "Self-assembled three-dimensional non-volatile memories", Micromachines 2010, vol. 1, pp. 1-18, Jan. 18, 2010.
Ju. H. Krieger, "Principle Operation of 3D Memory Device based on Piezoacousto Properties of Ferroelectric Films", InTech, Dec. 2010, pp. 3-16.
Ji Zhang et al., "A 3D RRAM Using Stackable ITXR Memory Cell for High Density Application", IEEE Xplore, Feb. 5, 2010, pp. 917-920.
Yajie Dong et al., "Si/a-Si Core/Shell Nanowires as Nonvolatile Crossbar Switches", Nano Letters 2008, vol. 8, No. 2, pp. 386-391.

(56) References Cited

OTHER PUBLICATIONS

R Stanley Williams et al., "The switching location of a bipolar memristor: chemical, thermal and structural mapping", Nanotechnology 22 (2011) 254015, pp. 1-6.
D. L. Kwong et al., "Vertical Silicon Nanowire Platformfor Low Power Electronics and Clean Energy Applications", Journal of Nanotechnology, vol. 2012, Article ID 492121, pp. 1-21.
Jiyoung Kim et al., "Novel Vertical-Stacked-Array-Transistor (VSAT) for ultra-high-density and cost-effective NAND Flash memory devices and SSD (Solid State Drive)", 2009 Symposium on VLSI Technology Digest of Technical Papers, pp. 186-187.
Ryota Katsumata et al., "Pipe-shaped BiCS Flash Memory with 16 Stacked Layers and Multi-Level-Cell Operation for Ultra High Density Storage Devices", 2009 Symposium on VLSI Technology Digest of Technical Papers, pp. 136-137.
Christophe J. Chevallier et al., "A 0.13 µm 64Mb Multi-Layered Conductive Metal-Oxide Memory" ISSCC 2010 / Session 14 / Non-Volatile Memory / 14.3, pp. 260-261.
Hong Sik Yoon et al., "Vertical Cross-point Resistance Change Memory for Ultra-High Density Non-volatile Memory Applications", 2009 Symposium on VLSI Technology Digest of Technical Papers, pp. 26-27.
Wonjoo Kim et al., "Multi-Layered Vertical Gate NAND Flash Overcoming Stacking Limit for Terabit Density Storage", 2009 Symposium on VLSI Technology Digest of Technical Papers, pp. 188-189.
I. G. Baek et al., "Realization of Vertical Resistive Memory (VRRAM) using cost effective 3D Process", IDEM 2011, 31.8.1, pp. 737-740.
Hang-Ting Lue et al., "A Highly Scalable 8-Layer 3D Vertical-Gate (VG) TFT NAND Flash Using Junction-Free Buried Channel BE-SONOS Device", IEEE 2010 Symposium on VLSI Technology Digest of Technical Papers, pp. 131-132.
Jaehoon Jang et al., "Vertical Cell Array using TCAT(Terabit Cell Array Transistor) Technology for Ultra High Density NAND Flash Memory", 2009 Symposium on VLSI Technology Digest of Technical Papers, pp. 192-193.

\* cited by examiner

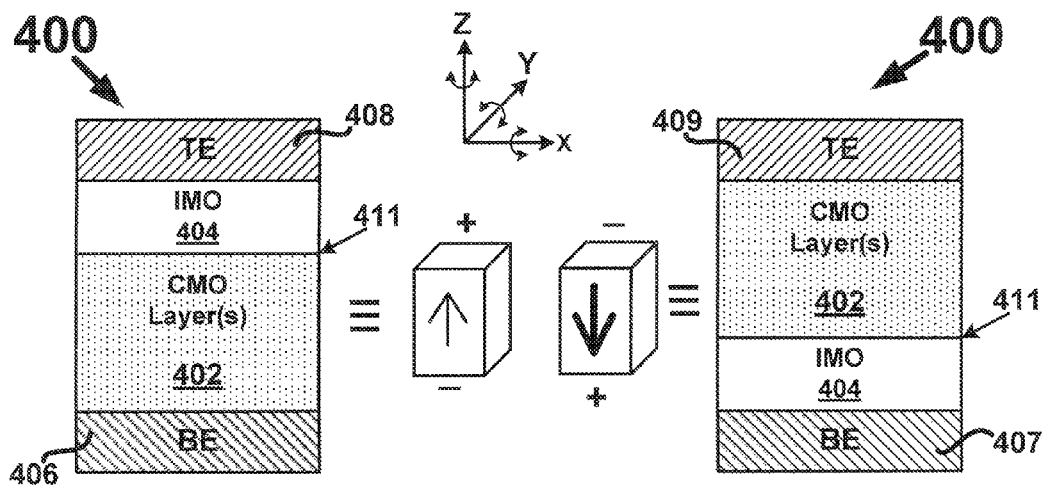
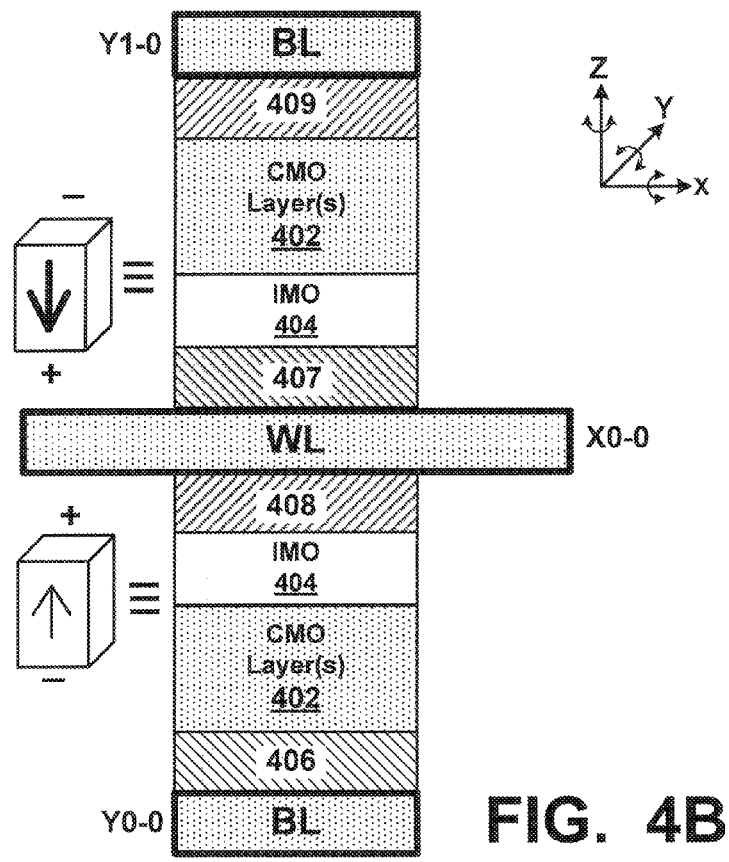
FIG. 4A
FIG. 4B

MULTILAYER CROSS-POINT MEMORY ARRAY HAVING REDUCED DISTURB SUSCEPTIBILITY

FIELD OF THE INVENTION

The present invention relates to memory arrays. More particularly, the present invention relates multi-layer cross-point memory arrays having reduced disturb susceptibilities.

BACKGROUND OF THE INVENTION

Flash memory is a type of non-volatile memory that can be electrically erased and reprogrammed. It is used in a wide variety of applications, including memory cards (e.g., SD, SDHC, Compact Flash—CF, microSDHC, miniSDHC, and Memory Stick—MS), USB Flash drives, tablet and notebook computers (e.g., as SSDs), mobile phones, smart phones, personal digital assistants and digital audio players. Recent advances in Flash memory technology and economies of scale have also led to the commercialization of cost-competitive, Flash-memory-based solid-state drives (SSDs), which provide long-term persistent storage similar to traditional hard disk drives (HDDs) but without the need for any moving parts, lower power consumption, and a higher resistance to shock.

Despite its wide-spread use, Flash memory does have various drawbacks. In particular, Flash memory has long programming times (>10 μs), a limited cycle endurance, and requires high programming voltages (>10V), which complicates the ability to scale the individual memory elements (i.e., memory "cells") down to nanometer dimensions. These and other drawbacks have led to a tremendous amount of research, in pursuit of alternative non-volatile memory technologies, which in addition to being scalable and are re-writable, have the high speed advantages of static random access memory (SRAM) and density advantage of dynamic random access memory (DRAM).

Various alternative non-volatile memory technologies have been proposed over the years. Some of these technologies include phase-change random access memory (PCRAM), in which thermal processes are used to control a phase transition in a chalcogenide material between amorphous and crystalline states; magnetoresistive RAM (MRAM), in which magnetizations of ferromagnetic films are used to inhibit or allow electron tunneling through intermediate insulating films; and resistive RAM (RRAM), in which a voltage for a data operation applied to a RRAM device is operative to change a resistance of the device and the resistance is indicative of a valued for stored data. Common among these alternative non-volatile memory technologies is the ability to configure a memory element to two or more non-volatile resistive states. The two or more non-volatile resistive states are used to represent two or more corresponding memory states. For example, in a binary resistive memory element that is configurable to one of two different resistive states, a high-resistance state may be used to represent a logic "0" and a low-resistance state may be used to represent a logic "1."

To be of practical use and compete with existing Flash memory technology, resistive memory elements, including PCRAM, MRAM, RRAM and other resistive-type memory elements, must be capable of being integrated into a tightly-packed array. Unfortunately, when resistive memory elements are arranged in a tightly-packed array, voltages applied during the reading or writing of selected memory elements can inadvertently interfere with (i.e., "disturb") the stored memory states of other nearby memory elements. If these interfering events (i.e., "disturbs") are prolonged and/or frequently repeated, the stored memory states of the disturbed memory elements can be undesirably altered, thereby compromising the reliability of data stored in the memory array and potentially resulting in corrupted data.

SUMMARY OF THE INVENTION

Multi-layer cross-point memory arrays having reduced disturb susceptibilities are disclosed. An exemplary multi-layer cross-point memory array includes one or more word line (WL) layers, one or more bit line (BL) layers interleaved with the one or more WL layers, and a plurality of memory layers. Each memory layer is disposed between an adjacent WL layer and an adjacent BL layer, and each memory layer includes memory elements configured between crossings (e.g., a cross-point) of WLs and BLs of the adjacent WL and BL layers. Memory elements in successive memory layers of the memory array are configured with opposing orientations. Alternating the orientations of the memory elements in this manner ensures that half-selected memory elements in the memory array, which arise during times when data operations are being performed on selected memory elements in the memory array, are subjected to stress voltages of a polarity of which they are least susceptible to being disturbed. For example, a memory elements can be configured to be less susceptible to program disturbs or erase disturbs.

Further details of the above-summarized exemplary embodiment of the invention, as well as details of other embodiments of the invention are described below with respect to the accompanying drawings, in which like reference numbers are used to indicate identical or functionally similar elements.

BRIEF DESCRIPTION OF THE DRAWINGS

The invention and its various embodiments are more fully appreciated in connection with the following detailed description taken in conjunction with the accompanying drawings, in which:

FIG. 4A is a cross-sectional drawing depicting an example of salient material layers of an exemplary conductive metal oxide (CMO) based memory element, which can be used to implement the memory elements of the multi-layer cross-point memory array in FIG. 1;

FIG. 4B is a cross-sectional drawing depicting an example of salient material layers of exemplary conductive metal oxide (CMO) based memory elements vertically configured in inverted and non-inverted orientations in a two-terminal cross-point array configuration;

Figure 1:
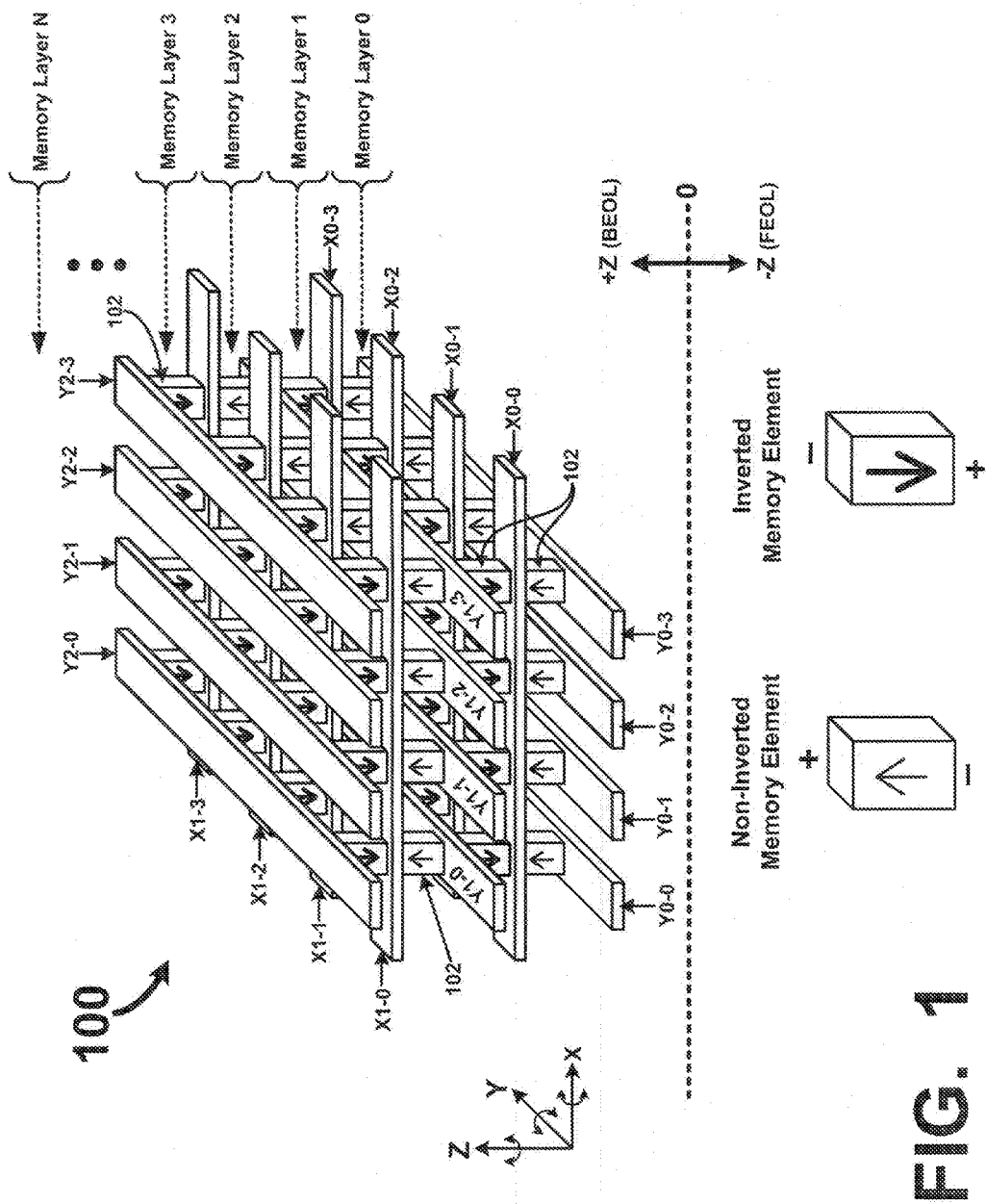
FIG. 1 is a perspective drawing depicting a multi-layer cross-point memory array including inverted and non-inverted memory elements, according to an embodiment of the present invention.

Like reference numerals refer to corresponding parts throughout the several views of the drawings. Note that most of the reference numerals include one or two left-most digits that generally identify the figure that first introduces that reference number. The depictions in the various drawing figures are not necessarily to scale.

DETAILED DESCRIPTION

Referring to FIG. 1 there is shown a multi-layer cross-point memory array 100, according to an embodiment of the present invention. The multi-layer cross-point memory array 100 comprises a plurality of successive memory layers: Memory Layer 0, Memory Layer 1, Memory Layer 2 and Memory Layer 3 disposed between alternating (i.e., interleaved) layers of word lines ("WLs" or "X" lines) extending in the x-direction and bit lines ("BLs" or "Y" lines) extending in the y-direction. Optionally, the number of memory layers can be expanded up to a memory layer N or can be reduced in number to only two layers, for example. Each of the memory layers depicted: Memory Layer 0, Memory Layer 1, Memory Layer 2 and Memory Layer 3 is configured between BLs of one of the BL layers: Y0, Y1 and Y2 and WLs of one of the WL layers: X0 and X1, such that a single memory element 102 is directly electrically coupled with and is electrically in series with its respective BL and WL. For example, Memory Layer 3 is configured between the third BL layer Y2 and the second WL layer X1 such that memory elements 102 are configured at and positioned between each cross-point of BLs: Y2-0, Y2-1, Y2-2 and Y2-3 of the third BL Layer Y2 and WLs: X1-0, X1-1, X1-2 and X1-3 of the second WL Layer 1 X1. The result is a three-dimensional matrix of individually-addressable (e.g., randomly accessible) memory elements 102 that can be accessed for data operations (e.g., read and write) at a granularity as small as a single memory element 102 or multiple memory elements (e.g., nibbles, bytes, pages, blocks, sectors, etc.). Note that in one embodiment, the memory elements 102 can be configured to store more than one bit of data (e.g., MLC).

In order to simplify illustration, the memory array 100 is shown to include only four rows and only four columns. In actual implementations, the memory array 100 would have hundreds, thousands or more of rows and columns, as will be readily appreciated and understood by those of ordinary skill in the art. The memory array 100 is also depicted as having four memory layers: Memory Layer 0, Memory Layer 1, Memory Layer 2 and Memory Layer 3. However, the principles and novel aspects of the present invention are applicable to any multi-layer cross-point memory array having two or more memory layers.

The WLs and BLs of the multi-layer cross-point memory array 100 can comprise conductive array lines made from an electrically conductive material, such as a metal (e.g., aluminum, copper or tungsten), metal alloy, non-metal conductive material such as a conductive ceramic or conductive metal oxide, or any other suitable electrically conductive material.

The memory elements 102 of the multi-layer cross-point memory array 100 comprise two-terminal devices capable of storing two or more memory states. For reasons discussed in detail below, the memory elements 102 in successive memory layers are configured with opposing orientations, as indicated by the up and down arrows in the memory elements 102. For example, in Memory Layer 1 the memory elements 102 are inverted (denoted by the heavy arrows pointing in the −Z direction (down arrows)) with respect to the orientation of the non-inverted memory elements 102 in Memory Layer 2 (arrows pointing in the +Z direction (up arrows)).

In one embodiment of the invention, the two-terminal memory elements 102 comprise two-terminal, non-volatile, re-writable resistive memory elements that are configurable to two or more resistive states (e.g., can store at least one bit of data). The different resistive states are used to represent two or more corresponding memory states, for example a logic "0" and a logic "1" in the case where each memory element 102 is configured for storing one bit of data (e.g., SLC) or logic states "00," "01," "10" and "11" when each memory element 102 is configured to store more than one bit of data (e.g., MLC). Although the exemplary memory arrays of the present invention described herein utilize two-terminal, non-volatile, re-writable resistive memory elements, the principles and concepts of the present invention are applicable to memory arrays comprising other types of memory elements, whether based on resistive states or on some other memory storing mechanism, whether re-writable or not, and/or whether volatile or non-volatile.

Figure 2A:
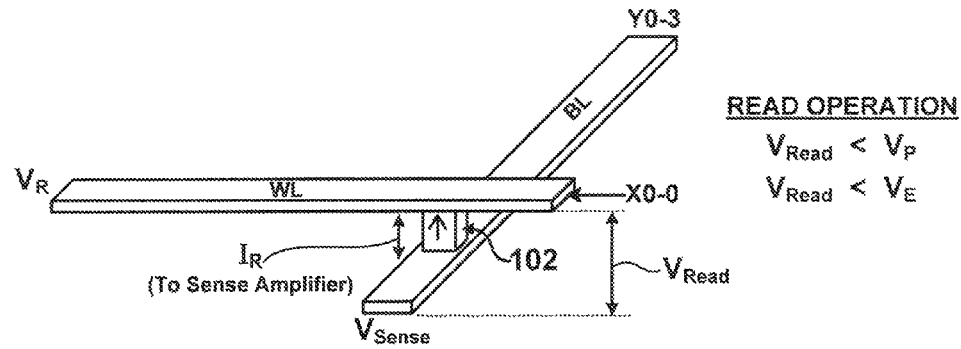
FIGS. 2A-2C are perspective drawings depicting how a selected two-terminal resistive non-inverted memory element disposed between a cross-point of a word line (WL) and bit line (BL) in the multi-layer cross-point memory array in FIG. 1 is read, programmed and erased, respectively.
Figure 2B:
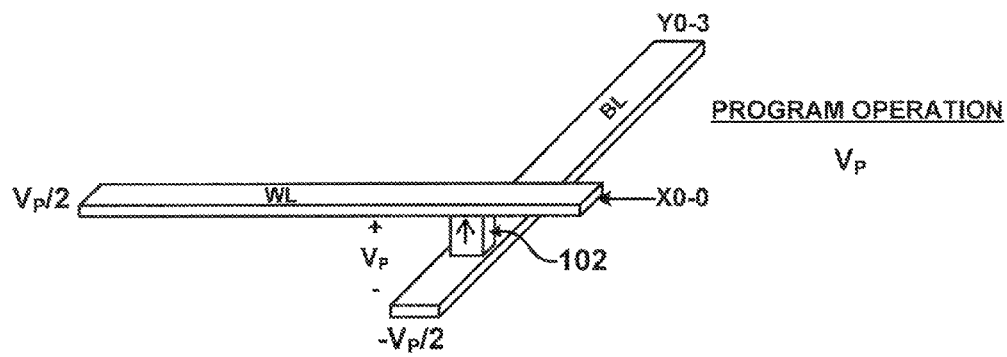
Figure 2C:
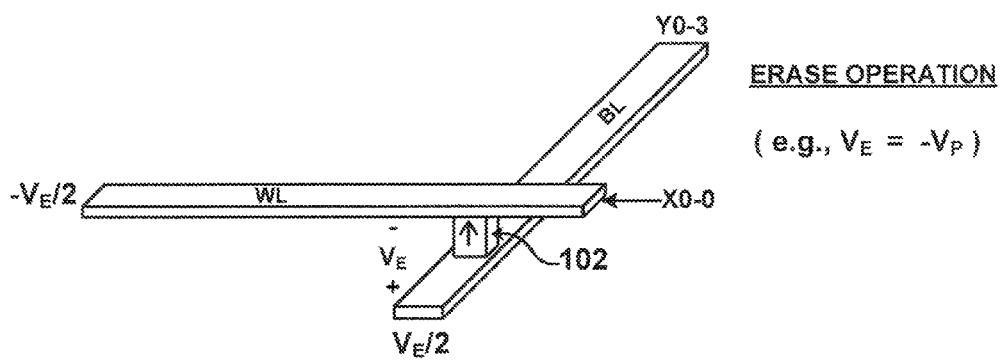

FIGS. 2A-2C illustrate how a selected non-inverted two-terminal resistive memory element 102 in the memory array 100 in FIG. 1, for example the memory element 102 disposed between a cross-point of WL X0-0 and BL Y0-3, is read and written (e.g., programmed and erased). To read the selected resistive memory element 102 (as in FIG. 2A), a read voltage $V_{READ}$ is applied across the terminals of the selected two-terminal resistive memory element 102. For example by applying a voltage $V_R$ to WL X0-0 and allowing a voltage on BL Y0-3 to float (e.g., float from some initial voltage potential $V_{Init}$ to a voltage $V_{Sense}$) thereby allowing a current from the selected memory element 102 charge the BL Y0-3. The read voltage $V_{READ}$ has a magnitude sufficient to generate a measurable read current $I_R$ through the selected resistive memory element 102 but not so high as to alter the stored memory state of the selected resistive memory element 102. The read current $I_R$ has a magnitude that is dependent upon the resistance of the selected resistive memory element 102. In some embodiments, the read current $I_R$ can be dictated by Ohm's law: $I_R=V_R/R$, where R represents the resistance of the selected memory element 102. In another embodiment, the memory element 102 has a non-linear I-V characteristic such that the read current $I_R$ is a non-linear function of the voltage applied across the terminals of the memory element 102. For example, $I_R=f(V_R)/R$. In a preferred embodiment, the non-linear I-V characteristic applies to all resistive states stored in the memory element and not just for one resistive state or a sub-set of resistive states. Moreover, the non-linear I-V characteristic applies to all polarities of voltages for data operations applied across the memory element 102 (e.g., positive and negative polarities of read and write voltages).

Accordingly, when the selected resistive memory element 102 is in a high-resistance state, the resulting read current $I_R$ is less than when the selected resistive memory element 102 is in a low-resistance state. The difference in read current levels is therefore indicative of the stored memory state (i.e., logic "0" or logic "1") of the selected resistive memory element 102. The read current $I_R$ or other related signal can be electrically communicated to an input of a sense amplifier or other measuring circuit, which operates to determine the stored memory state of the selected memory element based on the received signal. For example, BL Y0-3 can be electrically coupled with FEOL sense amp circuitry that compares the read current $I_R$ or other related signal with one or more other signals to output a data value that is indicative of the stored data (e.g., stored resistive state) in the selected memory element.

To program the selected resistive memory element 102 (as in FIG. 2B), a program signal $V_P$ is applied across the terminals of the selected resistive memory element 102, for example by applying $+V_P/2$ to WL X0-0 and $-V_P/2$ to BL Y0-3. The program signal $V_P$, which in one embodiment is applied in the form of a series of pulses, has a magnitude high enough to cause the resistance of the selected resistive memory element 102 to change or conform to a high-resistance state.

To erase the selected resistive memory element 102 (as in FIG. 2C), an erase signal $V_E$ that can have a polarity opposite that of the program voltage $V_P$ (e.g., $V_E=-V_P$) is applied across the terminals of the selected resistive memory element 102, for example by applying $-V_E/2$ to WL X0-0 and $+V_E/2$ to BL Y0-3. The erase signal $V_E$, which in one embodiment is applied in the form of a series of pulses, has a magnitude high enough to cause the resistance of the selected resistive memory element 102 to change or conform to a low-resistance state.

It should be noted that a "programmed" state in the exemplary embodiments of the invention described herein is defined as corresponding to a high-resistance state and an "erased" state is defined as corresponding to a low-resistance state. These definitions could be reversed, however, so that a programmed state corresponds to a low-resistance state and an erased state corresponds to a high-resistance state, as will be understood and appreciated by those of ordinary skill in the art. Furthermore, for memory elements 102 configured for MLC, depending on the number of bits stored per memory element 102, there can be several gradations of resistive values that are indicative of the stored data, such as a hard programmed state "00", a soft programmed state "01", a hard erased state "11" and a soft erase state "10", for example.

Figure 2D:
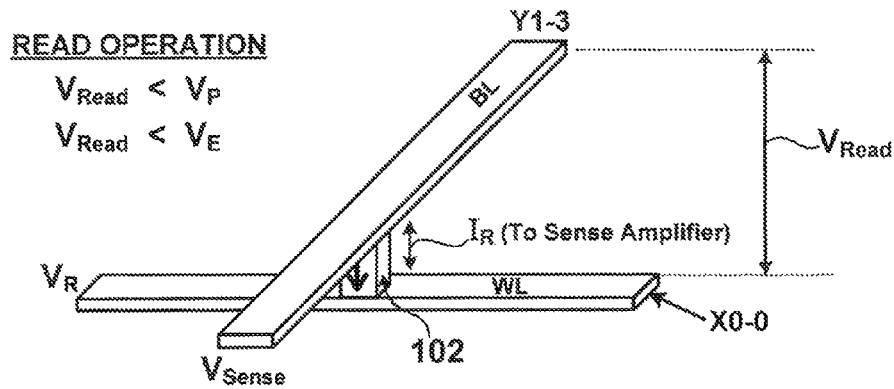
FIGS. 2D-2F are perspective drawings depicting how a selected two-terminal resistive inverted memory element disposed between a cross-point of a WL and BL in the multi-layer cross-point memory array in FIG. 1 is read, programmed and erased, respectively.
Figure 2E:
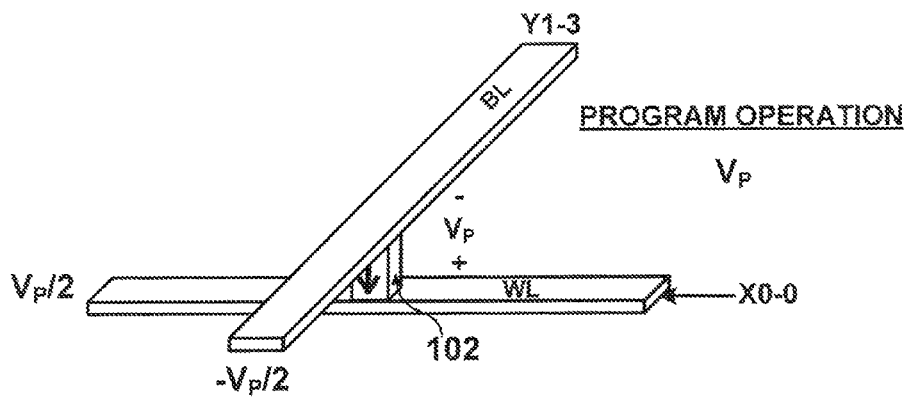
Figure 2F:
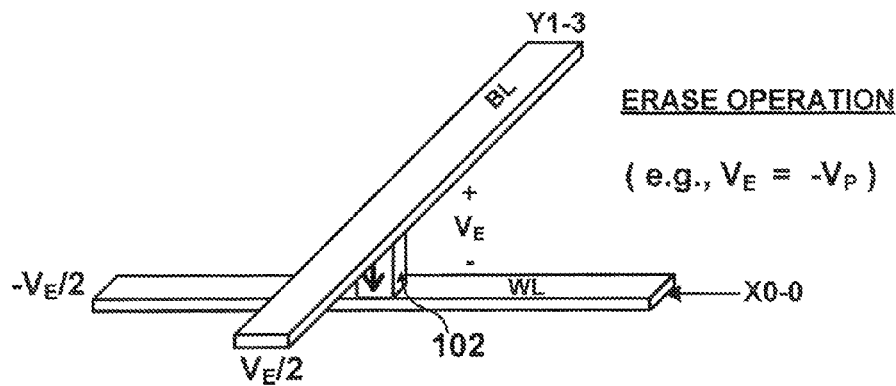

FIGS. 2D-2F illustrate how a selected inverted two-terminal resistive memory element 102 in the memory array 100 in FIG. 1, for example the memory element 102 disposed between a cross-point of WL X0-0 and BL Y1-3, is read and written (e.g., programmed and erased) and how the voltages for data operations to the inverted memory element 102 are altered from that of the non-inverted memory element 102 depicted in FIGS. 2A-2C.

In the description of the multi-layer cross-point memory array 100 above, data operations (i.e., read, program and erase operations) are shown as being performed on a single selected memory element 102. However, it should be noted that data operations may also or alternatively be performed on a plurality of memory elements simultaneously. In other words, in some embodiments of the invention, the multi-layer cross-point memory arrays of the present invention are configured so that a data operation may also or alternatively be performed on a larger group of memory elements such as a page or block of memory elements 102, simultaneously, where a block comprises one or more pages and a page comprises a plurality of nibbles, bytes, words or higher-bit group of memory elements 102 along multiple WLs and/or multiple BLs.

Figure 3:
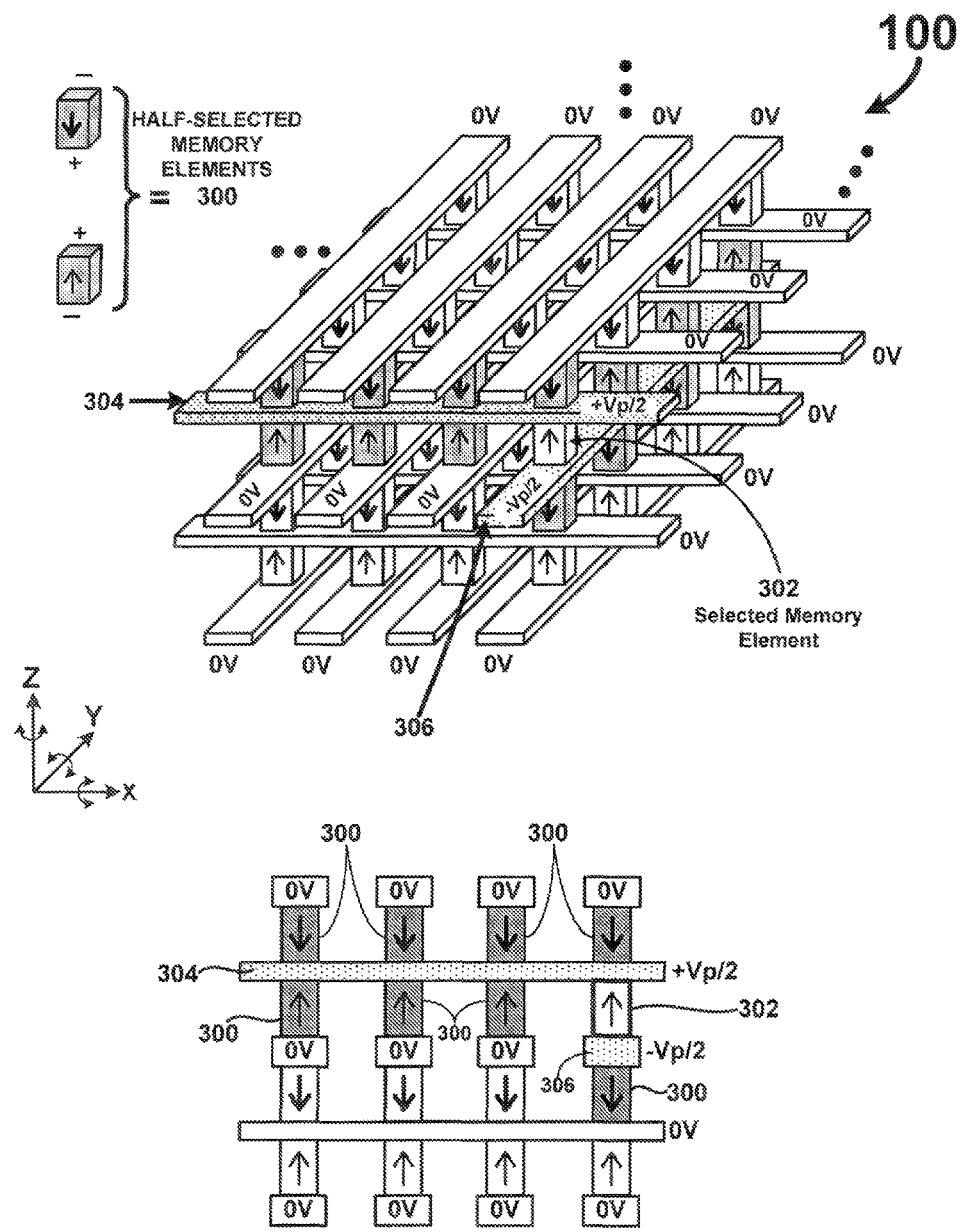
FIG. 3 is a perspective drawing of the multi-layer cross-point memory array in FIG. 1, highlighting those memory elements in the memory array that are half-selected during the programming of a selected memory element.

When data operations are being performed on memory elements 102 of the multi-layer cross-point memory array 100, the appropriate read, program and erase voltages are applied to the WLs and BLs between which the selected memory elements 102 are disposed, as was explained above in reference to FIGS. 2A-2F. The WLs and BLs associated with unselected memory elements are grounded or biased to some other voltage, to a prevent data operation from being performed on them during the time the data operation is being performed on the selected memory element. However, some memory elements 102 in the multi-layer cross-point memory array 100 share the same BL or same WL as does the selected memory element 102 and therefore unavoidably remain as "half-selected" during the data operation. For example, as illustrated in FIG. 3, when selected memory element 302 is being programmed, half-selected memory elements 300 arise along shared WL 304 in Memory Layers 2 and 3 and along shared BL 306 in Memory Layers 1 and 2.

Half-selected memory elements are subjected to stress voltages during times when a selected memory element is being read, programmed or erased. For example, in the programming operation illustrated in FIG. 3, each of the half-selected memory elements 300 are subjected to a positive stress voltage equal to Vp/2. Stress voltages are undesirable since they can disturb the stored memory states of half-selected memory elements. If prolonged and/or repeated, the stress voltages can eventually change (i.e., "flip") the stored memory states of the half-selected memory elements, thereby compromising the reliability of data stored in the memory array.

Stress voltages cannot be completely avoided without undesirably incorporating additional circuitry and decreasing the density of the memory array 100. However, using the principles and concepts of the present invention, they can be alleviated. Various types of memory elements, including the memory elements 102 used in the cross-point memory array 100, have asymmetric disturb characteristics, meaning that they are more susceptible to being disturbed by stress voltages of one polarity than by stress voltages of an opposite polarity. This asymmetry is exploited in the multi-layer cross-point memory arrays of the present invention by configuring the memory elements 102 in successive memory layers so that they have opposing orientations, as indicated by the up and down arrows in the different memory layers of the memory array 100 in FIGS. 1 and 3. Alternating the orientations of the memory elements in this manner ensures that half-selected memory elements in the memory array, which arise during times when data operations are being performed on selected memory elements in the memory array, are subjected to stress voltages of a polarity of which they are least susceptible to being disturbed.

The stress-voltage-relieving principle of the present invention is applicable to multi-layer cross-point memory arrays 100 utilizing any type of memory element that exhibits asymmetric disturb characteristics. One type of resistive memory element that has been observed to exhibit asymmetric disturb characteristics is the conductive metal oxide (CMO) based memory element. A description of the CMO-based memory element, including how it may be used to implement the memory elements 102 of the multi-layer cross-point memory array 100 in FIG. 1, is provided below. It should be emphasized, however, that the description is merely exemplary and that other types of memory elements having asymmetric disturb characteristics may be employed. Accordingly, the present invention, as it is set forth in the appended claims, should not be construed as being limited to only memory arrays that utilize CMO-based memory elements.

FIG. 4A is a cross-sectional drawing depicting the salient material layers of an exemplary CMO-based memory element 400, both inverted and non-inverted. The CMO-based memory element 400 comprises a two- or multi-layered structure having at least one CMO layer 402 and an insulating metal oxide (IMO) layer 404. In the non-inverted memory element 400, the CMO layer 402 is electrically coupled with a first electrode 406 (e.g., a bottom electrode) and the IMO layer 404 is electrically coupled with a second electrode 408 (e.g., a top electrode—TE), such that the CMO layer 402 and IMO layer 404 are configured directly electrically in series between the first and second electrodes 406 and 408 and with each other. The CMO 402 and the IMO 404 are in direct contact with each other. Similarly, in the inverted memory element 400, the IMO 404 is electrically coupled with a first electrode 407 (e.g., a bottom electrode—BE) and the CMO 402 is electrically coupled with a second electrode 409 (e.g., a top electrode—TE), such that the CMO layer 402 and IMO layer 404 are configured directly electrically in series between the first and second electrodes 407 and 409 and with each other. In some embodiments, the IMO 404 and the CMO 402 are directly connected with their respective electrodes. Further details and useable variations of the CMO-based memory element 400 are described in U.S. patent application Ser. No. 11/095,026, filed Mar. 30, 2005, and published as U.S. Pub. No. 2006/0171200, and entitled "Memory Using Mixed Valence Conductive Oxides", U.S. patent application Ser. No. 12/653,836, filed Dec. 18, 2009, and published as U.S. Pub. No. 2010/0157658, and entitled "Conductive Metal Oxide Structures In Non-Volatile Re-Writable Memory Devices"; U.S. patent application Ser. No. 11/881,496, filed Jul. 26, 2007, now U.S. Pat. No. 7,897,951, and entitled "Continuous Plane Of Thin-Film Materials For A Two-Terminal Cross-Point Memory;" and U.S. patent application Ser. No. 12/653,851, filed Dec. 18, 2009, and published as U.S. Pub. No. 2010/0159641, and entitled "Memory Cell Formation Using Ion Implant Isolated Conductive Metal Oxide," all of which are incorporated herein by reference in their entirety for all purposes.

The CMO layer 402 comprises an ionic conductor that is electrically conductive and includes mobile oxygen ions 410. The material for the CMO layer 402 has a crystalline structure (e.g., single crystalline or polycrystalline) and the crystalline structure does not change due to data operations on the memory element 400. For example, read and write operations to the memory element 400 do not alter the crystalline structure of the CMO layer 402.

The IMO layer 404 comprises a high-k dielectric material having a substantially uniform thickness approximately less than 50 Angstroms and is an ionic conductor that is electrically insulating. The IMO layer 404 is operative as a tunnel barrier that is configured for electron tunneling during data operations to the memory element 400 and as an electrolyte to the mobile oxygen ions 410 and is permeable to the mobile oxygen ions 410 during write operations to the memory element 400 such that during write operations oxygen ions 410 are transported 412 between the CMO and IMO layers 402 and 404.

In various embodiments, in regards to the layers 402 and 404 of FIGS. 4A-8, the layer 402 can include one or more layers of a conductive metal oxide material, such as one or more layers of a conductive metal oxide-based ("CMO-based") material, for example. The CMO material is selected for it properties as a variable resistive material that includes mobile oxygen ions 410 and is not selected based on any ferroelectric properties, capacitive, piezoelectric properties, phase change properties, magnetic properties, superconductive properties (e.g., at room temperature or otherwise), or for any mobile metal ion properties. In various embodiments, layer 402 can include but is not limited to a manganite material, a perovskite material selected from one or more the following: $PrCaMnO_x$ (PCMO), $LaNiO_x$ (LNO), $SrRuO_x$ (SRO), $LaSrCrO_x$ (LSCrO), $LaCaMnO_x$ (LCMO), $LaSrCaMnO_x$ (LSCMO), $LaSrMnO_x$ (LSMO), $LaSrCoO_x$ (LSCo0), and $LaSrFeO_x$ (LSFeO), where x is nominally 3 for perovskites (e.g., x≤3 for perovskites) or layer 402 can be one or more layers of a conductive binary oxide material comprised of a binary metal oxide having the form $A_XO_Y$, where A represents a metal and O represents oxygen. The conductive binary oxide material may be doped (e.g., with niobium Nb, fluorine F, and/or nitrogen N) to obtain the desired conductive properties for a CMO.

In various embodiments, layer 404 can include but is not limited to a material for implementing a tunnel barrier layer and is also an electrolyte that is permeable to the mobile oxygen ions 410 at voltages for write operations applied to the memory element 400. Suitable materials for the layer 404 include but are not limited to one or more of the following: high-k dielectric materials, rare earth oxides, rare earth metal oxides, transition metal oxides, yttria-stabilized zirconia (YSZ), zirconia ($ZrO_x$), yttrium oxide ($YO_x$), erbium oxide ($ErO_x$), gadolinium oxide ($GdO_x$), lanthanum aluminum oxide ($LaAlO_x$), and hafnium oxide ($HfO_x$), aluminum oxide (Ax), silicon oxide (SiOx), and equivalent materials. Typically, the layer 404 comprises a thin film layer having a substantially uniform thickness of approximately less than 50 Angstroms (e.g., in a range from about 5 Angstroms to about 35 Angstroms).

Attention is now directed to FIG. 4B, where for memory elements 400 used to implement the memory elements 102 of the multi-layer cross-point memory array 100 in FIG. 1, the first electrode 406 of each non-inverted CMO-based memory element 400 is electrically coupled with a BL (e.g., a Y-line Y0-0) of an adjacent BL layer and the second electrode 408 is electrically coupled with a WL (e.g., a X-line X0-0) of an adjacent WL layer. Alternatively, the first electrode 401 of each inverted CMO-based memory element 400 is electrically coupled with a WL (e.g., X0-0) of an adjacent WL layer and the second electrode 409 is coupled to a BL (e.g., Y1-0) of an adjacent BL layer. The result in either alternative configuration is a multi-layered cross-point memory array in which the CMO-based memory elements 400 in successive vertically stacked memory layers are configured in opposing orientations (i.e., non-inverted in one layer and inverted in the adjacent layer).

Figure 4C:
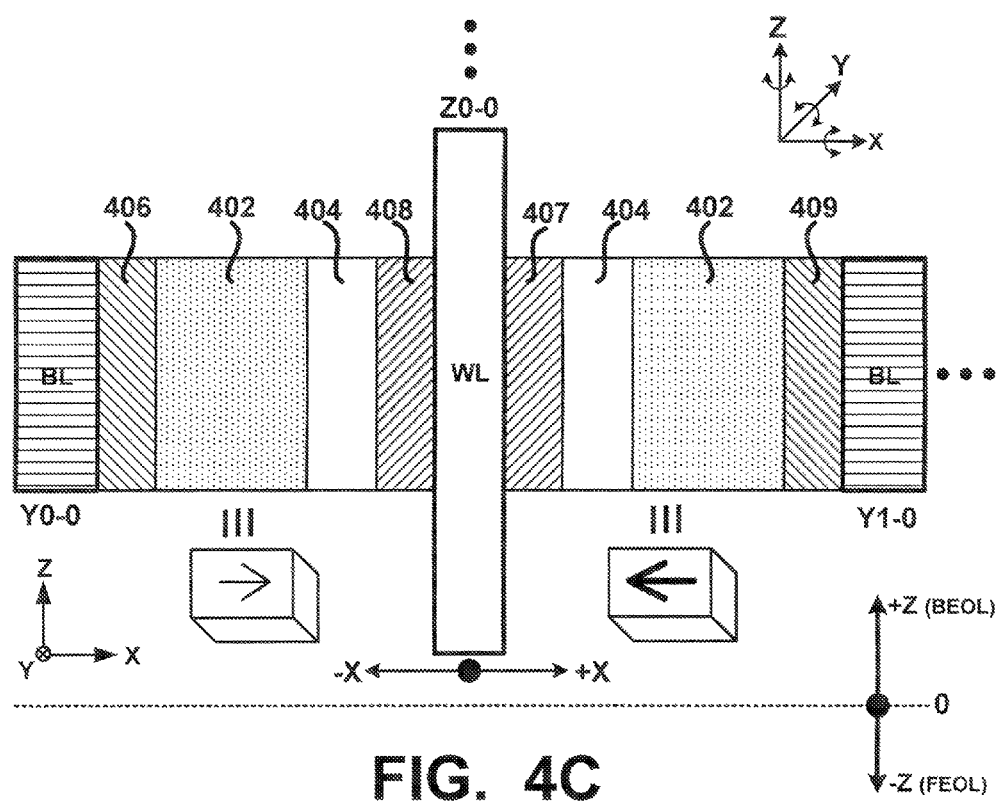
FIG. 4C is a cross-sectional drawing depicting the salient material layers of exemplary conductive metal oxide (CMO) based memory elements horizontally configured in inverted and non-inverted orientations (i.e., they are horizontally opposed) in a rotated two-terminal cross-point array configuration.
Figure 5A:
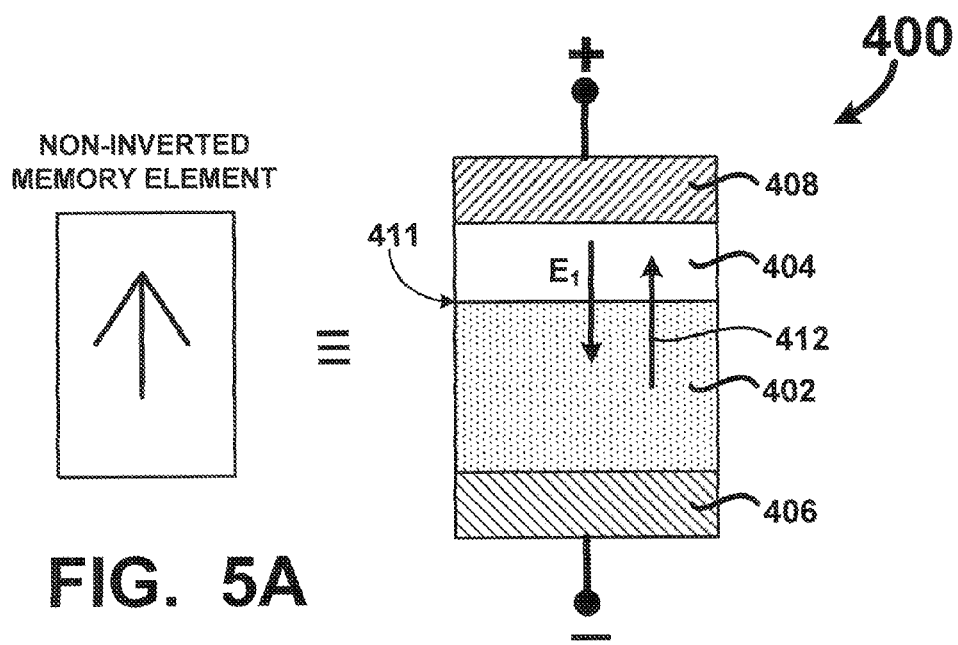
FIGS. 5A and 5B are cross-sectional drawings depicting a CMO-based memory element in a non-inverted and inverted orientation, respectively.
Figure 5B:
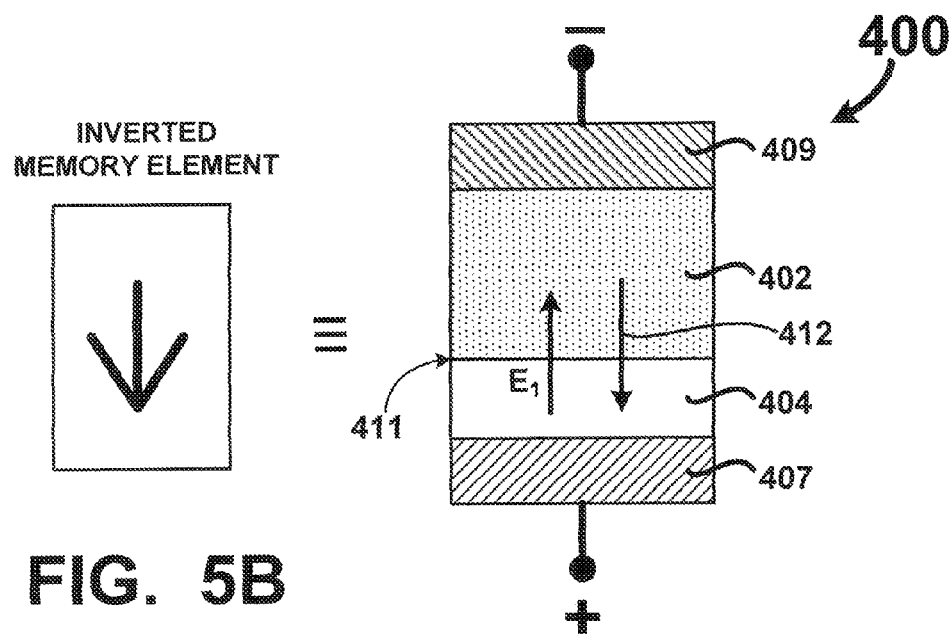

Turning now to FIG. 4C, another BEOL configuration for an array is depicted. Here, the configuration depicted in FIG. 4B has been rotated 90 degrees clockwise about the Y-axis such that the WL is now aligned along the Z-axis and is denoted as Z0-0 instead of X0-0. The BLs Y0-0 and Y1-0 are still aligned with the Y-axis. Therefore, the present invention is not limited to the configuration depicted in FIG. 1 and the array 100 can be rotated about the X, Y, Z axes, or combinations thereof, to obtain different orientations. In FIG. 4C, the memory elements 400 are now horizontally opposed to each other with electrodes 407 and 408 electrically coupled with the WL Z0-0. Here the non-inverted memory element 400 has its arrow pointing to the right along the +X axis; whereas, the inverted memory element 400 has its arrow pointing to the left along the –X axis.

In the description that follows, it will be assumed for sake of illustration that the first electrodes 406 of the non-inverted CMO-based memory elements 400 are coupled to the BLs and the second electrodes 408 are electrically coupled with the WLs; whereas, the first electrodes 407 of the inverted memory elements 400 are electrically coupled with the WLs and the second electrodes 409 are electrically coupled with the BLs. According to this configuration of CMO-based memory elements 400, a "non-inverted" memory element may then be defined as corresponding to a CMO-based memory element 400 having the orientation shown in FIG. 5A and an "inverted" CMO-based memory element may be defined as corresponding to a CMO-based memory element 400 having the orientation shown in FIG. 5B. Those of ordinary skill in the art will appreciate and understand, however, that these definitions of what constitutes an inverted CMO-based memory element 400 as opposed to a non-inverted CMO-based memory element 400 are arbitrary and, therefore, may be reversed. In the examples depicted in FIGS. 5A and 5B, the memory element 400 can be less susceptible to positive stress voltages (e.g., for program and read operations). As such, the arrow for the inverted and non-inverted memory elements 400 point in the direction of the electrode (i.e., 407 or 408) to which a positive voltage potential is applied during data operations to take advantage of the lower susceptibility to positive stress voltages. On the other hand, if the memory elements 400 were less susceptible to negative stress voltages (e.g., for erase and read operations), then the arrows could point to the electrode (e.g., 406 or 409) to which a negative voltage potential is applied during data operations to take advantage of the lower susceptibility to negative stress voltages.

Figure 6A:
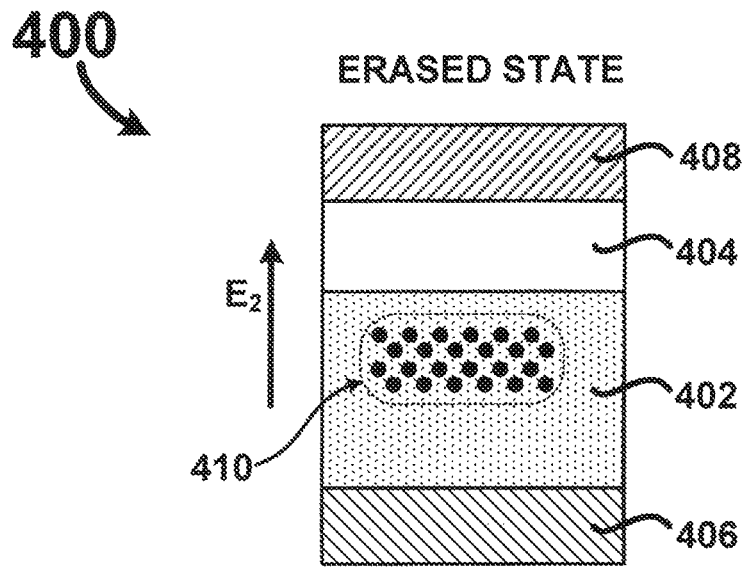
FIGS. 6A and 6B are cross-sectional drawings depicting a CMO-based memory element in an erased state and a programmed state and relative positions of mobile oxygen ions in those states, respectively.
Figure 6B:
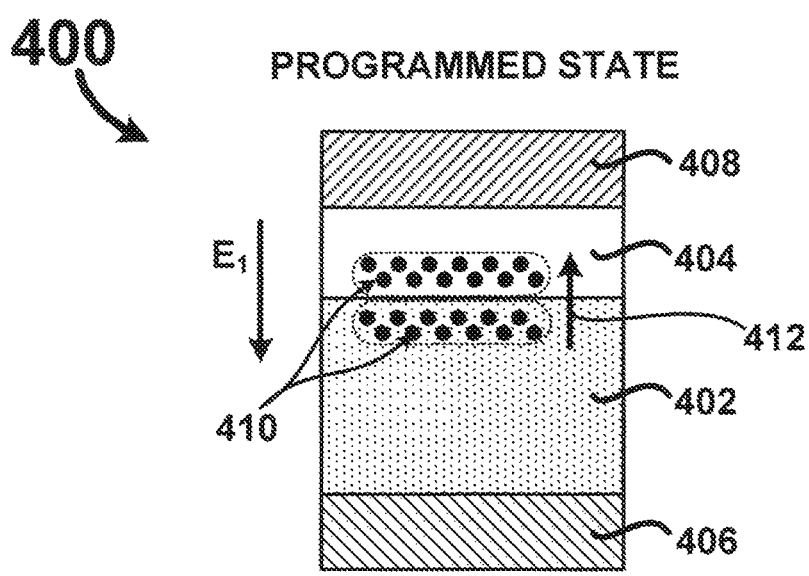

FIGS. 6A and 6B are cross-sectional drawings depicting the CMO-based memory element 400 in an erased state and a programmed state, respectively. When in an erased state (FIG. 6A), negatively-charged oxygen ions (e.g., oxygen anions) 410, denoted by the small black-filled circles, are mostly concentrated in the CMO layer 402, and the CMO-based memory element 400 exhibits a low resistance to current (i.e., is in a low-resistance state). Conversely, when in a programmed state (FIG. 6B), the negatively-charged oxygen ions 410 are distributed between the IMO layers 402 and 404, and the CMO-based memory element 400 exhibits a high resistance to current (i.e., is in a high-resistance state). (Note that the definitions of what constitutes a "programmed" state and what constitutes an "erased" state are arbitrary. Here, a programmed state is defined as corresponding to a high-resistance state and an erased state is defined as corresponding to a low-resistance state. However, these definitions could be reversed, as will be understood and appreciated by those of ordinary skill in the art.) In FIG. 6B, at least a portion of the mobile oxygen ions 410 that were positioned in the CMO 402 are transported 412 from the CMO 402 into the IMO 404. Here, the mobile oxygen ions 410 are transported 412 in a direction opposite to a first electric field $E_1$ that is generated by the application of a programming voltage across electrodes 406 and 408.

The CMO-based memory element 400 is a "bipolar" memory element, meaning that a voltage of one polarity is applied across its terminals to program it and a voltage of opposite polarity is applied across its terminals to erase it. The magnitudes of program and erase voltages can be the same or different and the waveforms for the applied voltages for program, erase, write, and read can include but are not limited to square waves, saw tooth waves, sine waves, and complex waveforms, just to name a few. Data operation voltages can occur using a single pulse or using multiple pulses. The timing, duration, magnitudes, wave shape, and polarities of data operation voltages will be application specific. To prevent the overwriting of stored data during read operations and the transport 412 of the mobile oxygen ions 410, the magnitudes of read voltages are less than the magnitudes or write voltages (e.g., program and erase voltages).

Figure 7:
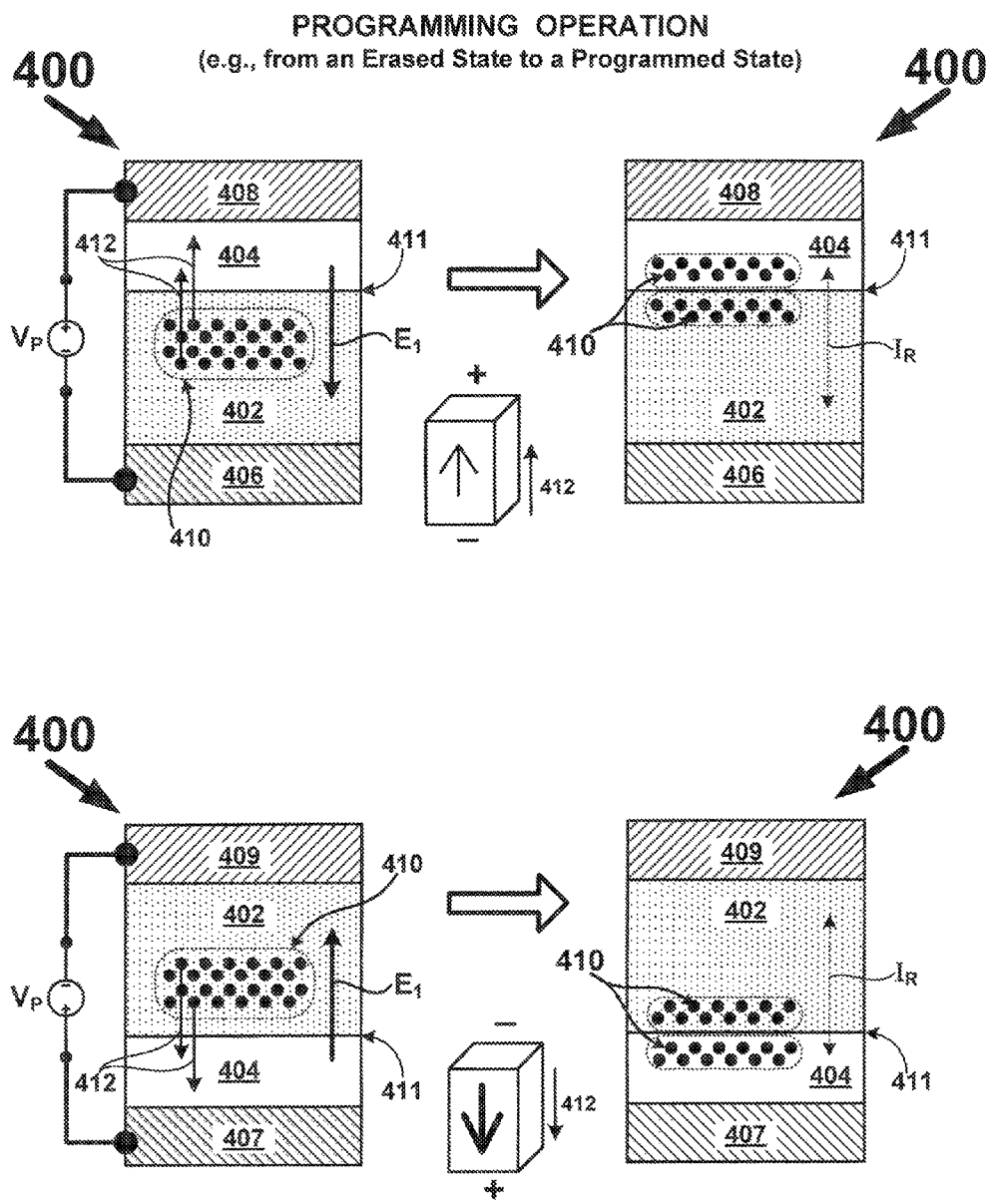
FIG. 7 is a drawing illustrating a programming operation on inverted and non-inverted CMO-based memory elements.

FIG. 7 is a drawing depicting a program operation on a non-inverted and an inverted memory element 400, during which the CMO-based memory element 400 is programmed from a low-resistance, erased state to a high-resistance, programmed state. A program voltage signal $V_P$ comprising one or more program pulses is applied across the electrodes 406 and 408 of the non-inverted CMO-based memory element 400 and across the electrodes 407 and 409 of the inverted memory element 400. The program voltage signal $V_P$ creates a pulsed electric field $E_1$ in the CMO and IMO layers 402 and 404 that forces at least a portion of the negatively-charged oxygen ions 410 to be transported 412 (e.g., to migrate) from the CMO layer 402 into the IMO layer 404, causing the CMO-based memory element 400 to conform to a high-resistance, programmed state. (Note that when configured in the multi-layer cross-point memory array 100 in FIG. 1, the program voltage signal $V_P$ is applied via the WL and BL between which the memory element 400 being programmed is disposed, similar to as shown in FIGS. 2B and 2E above. Erase and read voltage signals $V_E$ and $V_R$ applied to memory elements during erase and read operations (discussed below) are also applied via the memory elements respective BLs and WLs, similar to as shown above in FIGS. 2C and 2F for erase and FIGS. 2A and 2D for read above. In FIG. 7, transport 412 of the mobile oxygen ions 410 is in the same direction as the arrows for the non-inverted and inverted memory elements 400.

Figure 8:
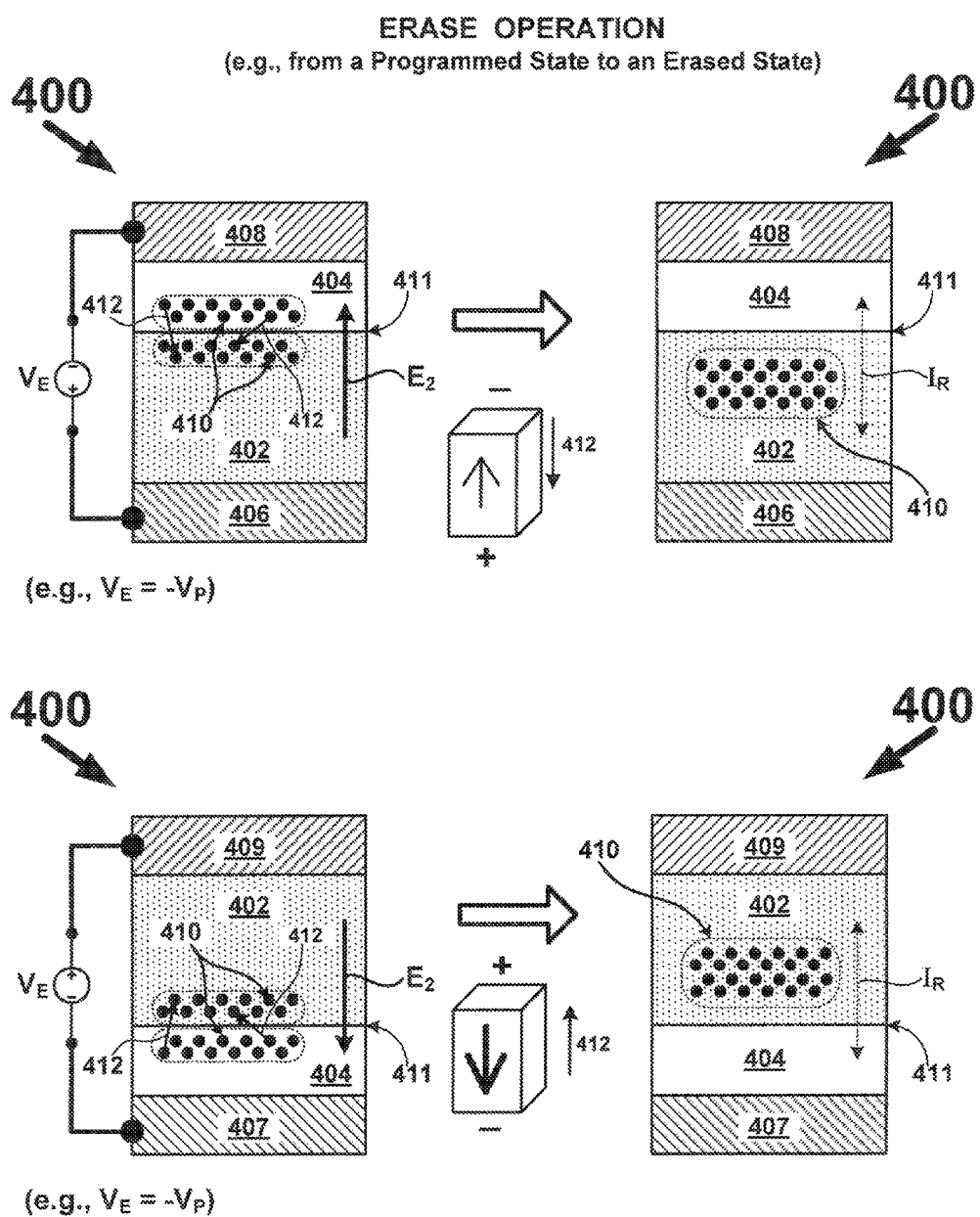
FIG. 8 is a drawing illustrating the erase operation on inverted and non-inverted CMO-based memory elements.

FIG. 8 is a drawing depicting an erase operation on a non-inverted and an inverted memory element 400, during which the CMO-based memory element 400 is erased from a high-resistance, programmed state to a low-resistance, erased state. An erase voltage signal $V_E$ comprising one or more erase pulses of opposite polarity to the program voltage signal $V_P$ (e.g., $V_E=-V_P$) is applied across the electrodes 406 and 408 of the non-inverted memory element 400 and across the electrodes 407 and 409 of the inverted memory element 400. The erase voltage signal $V_E$ creates a pulsed electric field E2, opposite in polarity to that of E1, in the CMO and IMO layers 402 and 404, which forces substantially all of the portion of negatively-charged oxygen ions 410 to be transported 412 (e.g., to migrate) from the IMO layer 404 back into the CMO layer 402, resulting in the CMO-based memory element 400 conforming to a low-resistance, erased state. In FIG. 8, transport 412 of the mobile oxygen ions 410 is in the opposite direction of the arrow for the non-inverted and inverted memory elements 400.

Once the CMO-based memory element 400 has been programmed or erased to either resistive state, it maintains the resistive state to which it has been erased or programmed, even in the absence of electrical power. A battery backup or other power source, such as a capacitor or the like, is not required to retain the stored data. In other words, the CMO-based memory element 400 is non-volatile. In addition to being non-volatile, the CMO-based memory element 400 is re-writable, meaning that they it is capable of being programmed and erased over and over again.

The exemplary program and erase operations describe above demonstrate how the CMO-based memory element 400 is configurable between two non-volatile resistive states, one which is used to represent a logic "0" and the other to represent a logic "1." In other embodiments of the invention in which CMO-based memory elements 400 are used to implement the memory elements 102 of the multi-layer cross-point memory array 100 in FIG. 1, the CMO-based memory elements 400 are configured to operate as multi-level memory elements (i.e., multi-level memory cells or "MLCs") having more than two resistive states. For example, in one MLC embodiment, each CMO-based memory element 400 is configurable to four distinct resistive states, with each resistive state corresponding to one of four logic states "00," "01," "10," and "11." Different magnitudes and polarities of program and erase voltages of one or more pulses having varying pulse shapes and durations can be used to perform the write operations on the CMO-based memory element 400 configured for MLC. Also, other types of SLC or MLC memory cells or memory elements (i.e., besides CMO-based memory elements) may alternatively be used.

The memory state stored by the CMO-based memory element 400 is read by applying a read voltage $V_R$ across the terminals of the memory elements (e.g., across electrodes 406 and 408 or 407 and 409). The read voltage $V_R$ is set to have a magnitude sufficient to generate a measurable read current $I_R$ through the CMO-based memory element 400 but not so high as to cause the negatively-charged oxygen ions 410 in the CMO layer 402 to be transported 412 between the CMO layer 402 and the IMO layer 404. The magnitude of the resulting read current $I_R$ is dependent upon the resistive state of the CMO-based memory element 400, and can be dictated by Ohm's law (i.e., $I_R=V_R/R$), where R is the resistance of the CMO-based memory element 400. In another embodiment, the memory element 400 has a non-linear I-V characteristic such that the read current $I_R$ is a non-linear function of the voltage applied across the terminals of the memory element 400. For example, $I_R=f(V_R)/R$. In a preferred embodiment, the non-linear I-V characteristic applies to all resistive states stored in the memory element and not just for one resistive state or a sub-set of resistive states. Moreover, the non-linear I-V characteristic applies to all polarities of voltages for data operations applied across the memory element 400 (e.g., positive and negative polarities of read and write voltages). Accordingly, when the CMO-based memory element 400 is in a high-resistance state, the read current $I_R$ that results is lower than when the CMO-based memory element 400 is in a low-resistance state. The read current $I_R$ is, therefore, indicative of the stored memory state (i.e., logic "0" or logic "1") of the CMO-based memory element 400. When the CMO-based memory element 400 is configured between a WL and BL in the multi-layer cross-point memory array 100, the read current $I_R$ or other related signal is directed to or along the memory element's BL to the input of a sense amplifier or other measuring circuit, which operates to determine the stored memory state of the selected memory element based on the received signal. In FIGS. 7 and 8, the read current $I_R$ can be generated by applying read voltage potentials to the terminals (e.g., across the electrodes) of the memory elements 400.

Figure 9:
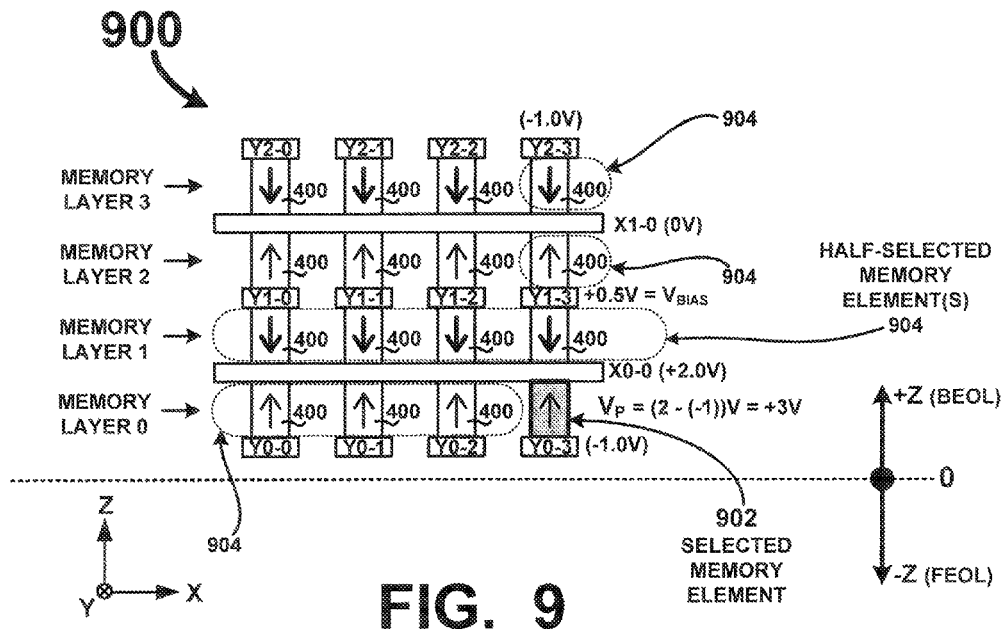
FIG. 9 is a cross-sectional drawing depicting a multi-layer cross-point memory array configured with inverted and non-inverted CMO-based memory elements, highlighting how half-selected memory elements are subjected to stress voltages during the programming of a selected memory element, in accordance with an embodiment of the present invention.

FIG. 9 is a cross-sectional drawing depicting a multi-layer cross-point memory array 900 configured with CMO-based memory elements similar to the CMO-based memory element 400 described above in reference to FIGS. 4A-8. As in the multi-layer cross-point memory array 100 in FIG. 1, each successive BEOL memory layer: Memory Layer 0, Memory Layer 1, Memory Layer 2 and Memory Layer 3 of the multi-layer cross-point memory array 900 includes memory elements 400 of opposing orientations. CMO-based memory elements 400 exhibit asymmetric disturb characteristics and are least susceptible to being disturbed when subjected to positive stress voltages ("positive" meaning greater than zero with reference to their respective bottom electrodes (e.g., BE 406 and 407 of FIG. 4A) of the CMO-based memory element 400) than when subjected to negative stress voltages.

When a CMO-based memory element 400 of the multi-layer cross-point memory array 900, for example selected CMO-based memory element 902, is selected to be programmed, a program voltage signal $V_P$ comprised of one or more program pulses is applied across the selected CMO-based memory element 902. In this exemplary embodiment, +2V is applied to the WL X0-0 while −1V is applied to BL Y0-3, resulting in a program signal $V_P$ of +3.0V appearing across the terminals (406, 408) of selected CMO-based memory element 902. Unselected WLs and BLs are biased to 0V or 0.5V.

Half-selected memory elements, including half-selected memory elements 904, are prevented from being subjected to negative stress voltages, since the orientations of the CMO-based memory elements 400 in successive memory layers are reversed—one memory layer including non-inverted CMO-based memory elements 400 and the next succeeding memory layer including inverted CMO-based memory elements 400. (Note that BL Y1-3 is biased to a bias voltage $V_{BIAS}$=+0.5V, to further help in preventing half-selected memory elements 400 along BL Y1-3 in Memory Layer 1 from being inadvertently programmed during the programming of selected memory element 902.) Although the half-selected memory elements 904 are subjected to positive stress voltages when configured with inverted and inverted memory layer orientations, negative stress voltages are avoided. Hence, the data integrity of the memory array 900 as a whole is maximized.

Figure 10:
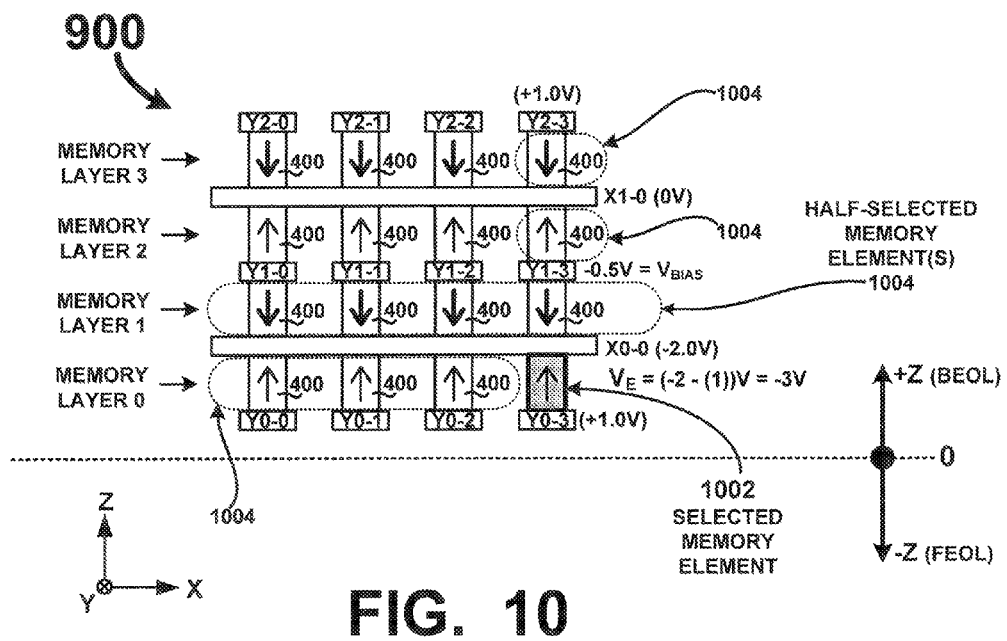
FIG. 10 is a cross-sectional drawing depicting a multi-layer cross-point memory array configured with inverted and non-inverted CMO-based memory elements, highlighting how half-selected memory elements are subjected to stress voltages during the erasing of a selected memory element, in accordance with an embodiment of the present invention.

When selected CMO-based memory element 1002 is being erased, as shown in FIG. 10, an erase voltage signal $V_E$ (e.g., $V_E$=$-V_P$) of one or more erase pulses of polarity opposite that of the program voltage signal $V_P$ is applied is across the selected CMO-based memory element 1002. In this exemplary embodiment, −2V is applied to WL X0-0 while +1V is applied to BL Y0-3, resulting in an erase signal $V_E$ of −3.0V appearing across the selected CMO-based memory element 1002. Note that BL Y1-3 is biased to a bias voltage VBIAS=−0.5V, to further help in preventing half-selected memory elements 1004 along BL Y1-3 in Memory Layer 1 from being inadvertently erased during the erasing of selected memory element 1002.

Figure 11A:
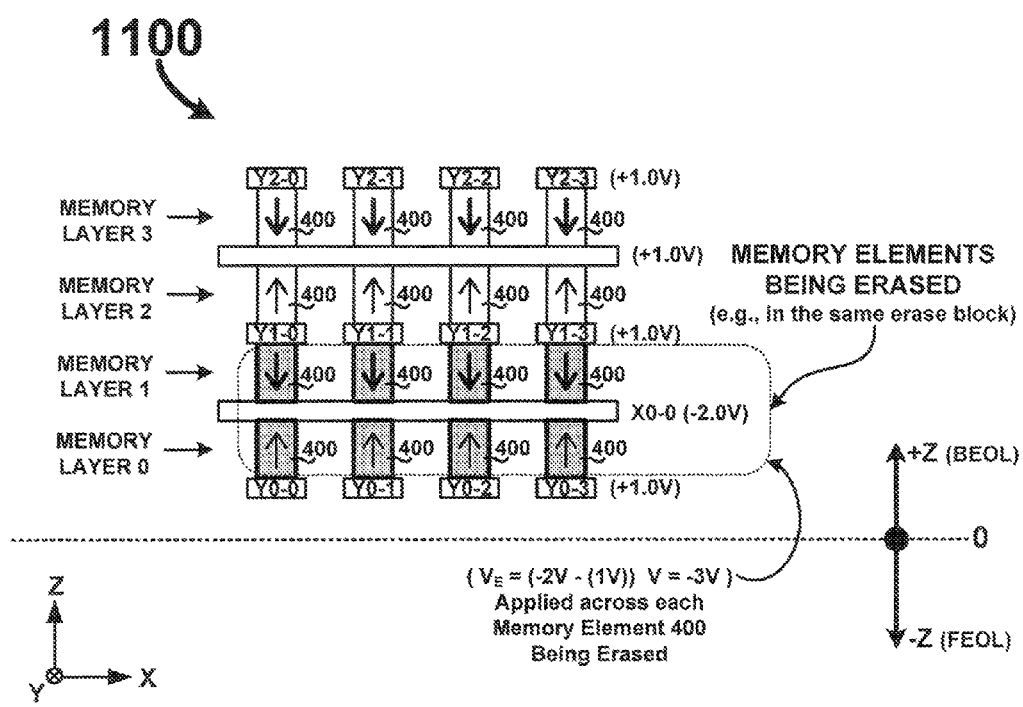
FIG. 11A is a cross-sectional drawing depicting a multi-layer cross-point memory array, highlighting how negative stress voltages and erase disturbs can be ignored by grouping inverted and non-inverted memory elements in a common erase block.

During the erase operation shown in FIG. 10, half-selected memory elements, such as half-selected memory elements 1004 are subjected to negative stress voltages. In one embodiment of the invention illustrated in FIG. 11, the CMO-based memory elements 400 in Memory Layers 0 and 1 of a multi-layer cross-point memory array 1100 are configured in a common erase block and what would otherwise be half-selected memory elements are configured so that they receive the full erase voltage signal $V_E$. In another embodiment, the CMO-based memory elements 400 in Memory Layers 0 and 1 of a multi-layer cross-point memory array 1100 are configured in a common erase block and are erased sequentially such that half selected memory elements that received erase disturbs are subsequently erased. In another embodiment all four memory layers are configured in a common erase block that are erased sequentially. When configured in the same erase block, all CMO-based memory elements in the erase block are erased simultaneously or subsequently during an erase operation, so, in effect, erase disturbs and negative stress voltages can be ignored.

The disturb susceptibility of a memory element to positive or negative stress can be based on several factors including but not limited to the thin-film materials selected for the memory element, the thickness of those thin-film materials, and data operations voltages, just to name a few. Here, based on the memory elements to be used, the inverted/non-inverted memory element configuration can be used in a memory array to minimize the effects of the worse case stress on half-selected memory elements. If the worse case stress is negative stress voltages, then the memory elements can be configured such that they are subjected to stress voltages of a polarity of which they are least susceptible to being disturbed. For example, a memory elements can be configured to be less susceptible to program disturbs or erase disturbs. In that read operations can also cause disturbs to half-selected memory elements, the WL and BL voltages applied to the array during a read operation can be selected to take advantage of the inverted/non-inverted memory element configuration and read operations can occur using stress voltages of a polarity of which the memory elements are least susceptible to being disturbed during read. For example, if the memory elements are least susceptible to positive stress voltages (e.g., program disturbs), then read operation voltages can be structured in a manner similar to the programming operation voltages of FIG. 9 with the caveat that the magnitude of read voltage potentials are less than the magnitude of programming voltage potentials and erase voltage potentials to prevent the overwriting of stored data during the read operation. Therefore, the magnitudes of the voltages for the programming operation of FIG. 9 can be reduced as necessary to execute a read operation that takes advantage of the lower susceptibly to positive stress voltages. On the other hand, if the memory elements are least susceptible to negative stress voltages (e.g., erase disturbs), then the memory elements can be oriented appropriately and the appropriate voltages for data operations can be applied to the memory elements to take advantage of the lower susceptibly to negative stress voltages. Accordingly, memory element orientation in each memory layer and data operations voltages for read and write (e.g., program and erase) can be selected to take advantage of an asymmetric disturb characteristic of the memory elements.

Figure 11B:
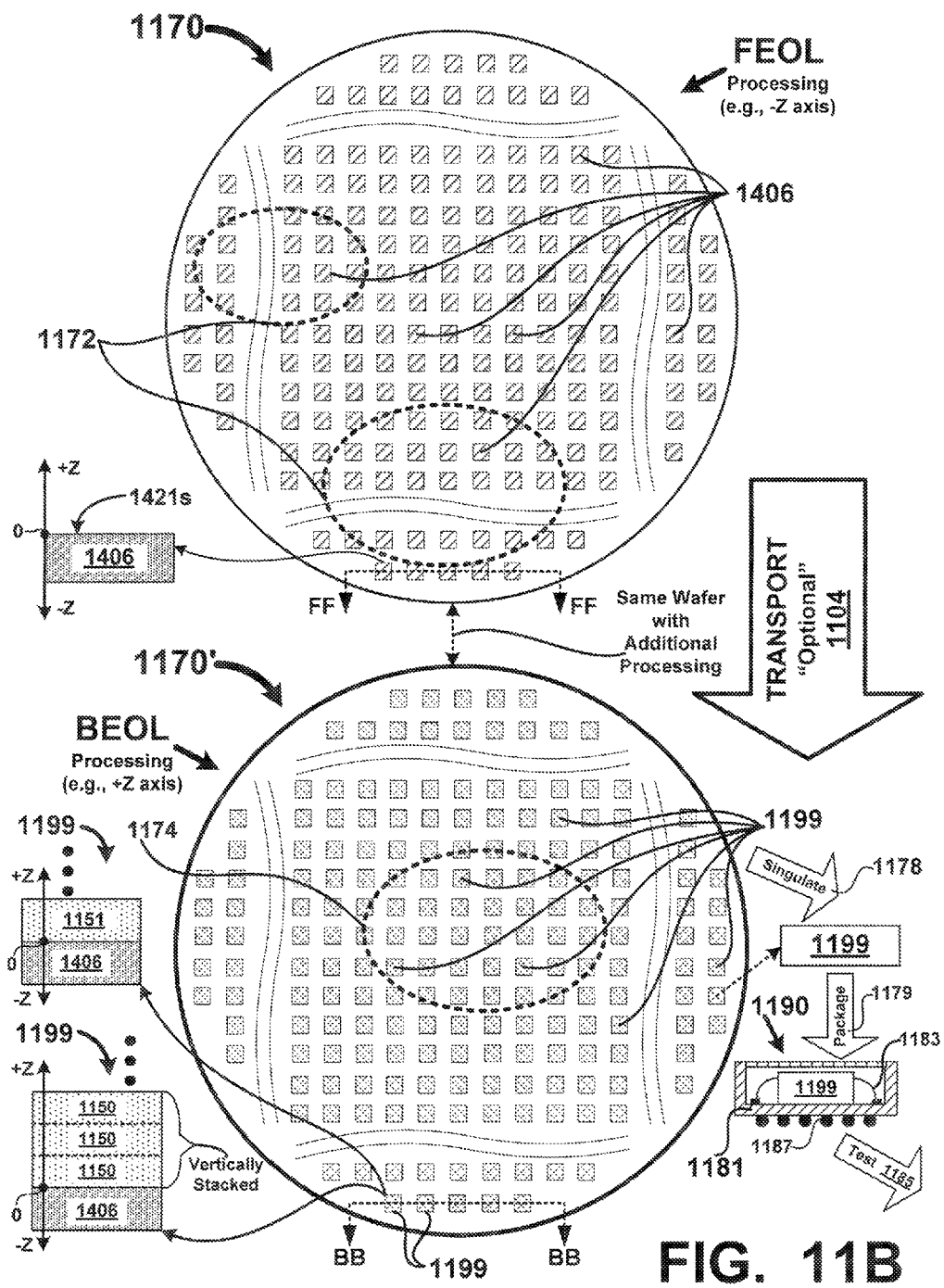
FIG. 11B depicts top plan views of a wafer processed FEOL to form a plurality of base layer die including active circuitry and an electrical interconnect structure and the same wafer subsequently processed BEOL to integrally form one layer or multiple layers of memory and their respective memory elements directly on top of the base layer die where the finished die can subsequently be singulated, tested, and packaged into integrated circuits.

FIG. 11B is a top plan view depicting a single wafer (denoted as 1170 and 1170') at two different stages of fabrication on the same wafer: FEOL processing on the wafer denoted as 1170 during the FEOL stage of microelectronics processing where active circuitry (e.g., CMOS circuitry) in logic layer 1408 is fabricated on the substrate that comprises base layer die 1406 (e.g., a silicon substrate or wafer—see FIGS. 14 and 15); followed by BEOL processing on the same wafer denoted as 1170' during the BEOL stage of microelectronics processing where one or more layers (e.g., 1151 or 1150) of BEOL non-volatile memory are fabricated directly on top of the FEOL logic layer 1408 (e.g., on an upper surface 1421s of the FEOL interlayer interconnect structure). The single layer 1151 or multiple vertically stacked layers 1150 are not glued, soldered, wafer bonded, or otherwise physically or electrically connected with the base layer die 1406, instead they are grown directly on top of the base layer die 1406 so that they are integrally connected with the base layer die 1406 and with one another, are electrically coupled with the semiconductor circuitry in the FEOL logic layer 1408, thereby forming a unitary integrated circuit die 1199 that includes monolithically integrated FEOL and BEOL portions (e.g., inseparable FEOL circuitry and BEOL memory portions). Wafer 1170 includes a plurality of the base layer die 1406 formed individually on wafer 1170 as part of the FEOL process. As part of the FEOL processing, the base layer die 1406 may be tested 1172 to determine their electrical characteristics, functionality, yield, performance grading, etc. After all FEOL processes have been completed, the wafer 1170 is optionally transported 1104 for subsequent BEOL processing (e.g., adding one or more layers of memory such as single layer 1151 or multiple layers 1150) directly on top of each base layer die 1406. A base layer die 1406 is depicted in cross-sectional view along a dashed line FF-FF where a substrate (e.g., a silicon Si wafer) for the die 1406 and its associated active circuitry in logic layer 1408 have been previously fabricated FEOL (e.g., using CMOS microelectronics fabrication processes) and are positioned along the −Z axis. For example, the one or more layers of memory (e.g., 1151 or 1150) are grown directly on top of an upper surface 1421s of each base layer die 1406 as part of the subsequent BEOL processing. Upper layer 1421s can be an upper planar surface of the aforementioned interlayer interconnect structure operative as a foundation for subsequent BEOL fabrication of the memory layers along the +Z axis. Here, to take advantage of the inverted/non-inverted memory element configurations described above, multiple layers 1151 of memory would be fabricated BEOL.

During BEOL processing the wafer 1170 is denoted as wafer 1170', which is the same wafer subjected to additional processing to fabricate the memory layer(s) and their associated memory elements directly on top of the base layer die 1406. Base layer die 1406 that failed testing may be identified either visually (e.g., by marking) or electronically (e.g., in a file, database, email, etc.) and communicated to the BEOL fabricator and/or fabrication facility. Similarly, performance graded base layer die 1406 (e.g., graded as to frequency of operation) may identified and communicated to BEOL the fabricator and/or fabrication facility. In some applications the FEOL and BEOL processing can be implemented by the same fabricator or performed at the same fabrication facility. Accordingly, the transport 1104 may not be necessary and the wafer 1170 can continue to be processed as the wafer 1170'. The BEOL process forms the aforementioned memory elements and memory layer(s) directly on top of the base layer die 1406 to form a finished die 1199 that includes the FEOL circuitry portion 1408 along the −Z axis and the BEOL memory portion along the +Z axis. For example, the memory elements (e.g., 102, 400) and their associated WLs and BLs can be fabricated during the BEOL processing. The types of memory elements that can be fabricated BEOL are not limited to those described herein and the materials for the memory elements are not limited to the memory element materials described herein. A cross-sectional view along a dashed line BB-BB depicts a memory device die 1199 with a single layer of memory 1151 grown (e.g., fabricated) directly on top of base die 1406 along the +Z axis, and alternatively, another memory device die 1199 with three vertically stacked layers of memory 1150 grown (e.g., fabricated) directly on top of base die 1406 along the +Z. Finished die 1199 on wafer 1170' may be tested 1174 and good and/or bad die identified. Subsequently, the wafer 1170' can be singulated 1178 to remove die 1199 (e.g., die 1199 are precision cut or sawed from wafer 1170') to form individual memory device die 1199. The singulated die 1199 may subsequently be packaged 1179 to form an integrated circuit chip 1190 for mounting to a PC board or the like, as a component in an electrical system (not shown) that electrically accesses IC 1190 to perform data operations on BEOL memory. Here a package 1181 can include an interconnect structure 1187 (e.g., pins, solder balls, or solder bumps) and the die 1199 mounted in the package 1181 and electrically coupled 1183 with the interconnect structure 1187 (e.g., using wire bonding or soldering). The integrated circuits 1190 (IC 1190 hereinafter) may undergo additional testing 1185 to ensure functionality and yield. The die 1199 or the IC 1190 can be used in any system requiring non-volatile memory and can be used to emulate a variety of memory types including but not limited to SRAM, DRAM, ROM, and Flash. Unlike conventional Flash non-volatile memory, the die 1199 and/or the IC's 1190 do not require an erase operation or a block erase operation prior to a write operation so the latency associated with conventional Flash memory erase operations is eliminated and the latency associated with Flash OS and/or Flash file system required for managing the erase operation is eliminated. Random access data operations to the die 1199 and/or the IC's 1190 can be implemented with a granularity of 1-bit (e.g., a single memory element) or more (e.g., a page or block of memory elements). Moreover, a battery back-up power source or other AC or DC power source is not required to retain data stored in the memory elements embedded in each memory layer (1151 or 1150) because the memory is non-volatile and retains stored data in the absence of electrical power. Another application for the IC's 1190 is as a replacement for conventional Flash-based non-volatile memory in embedded memory, solid state drives (SSD's), hard disc drives (HDD's), or cache memory, for example.

Figure 11C:
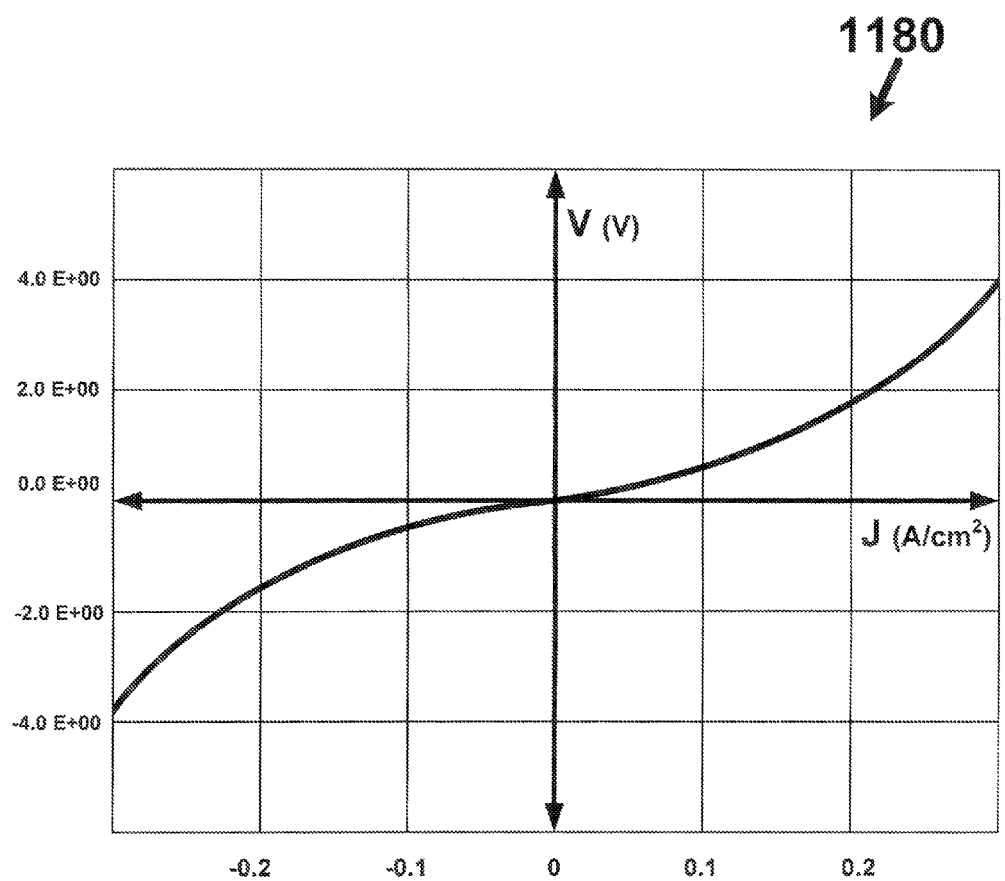
FIG. 11C depicts a graphical representation of an example of a non-linear I-V characteristic for a discrete two-terminal memory element with integral selectivity for an improved half-select ratio.

FIG. 11C graphically depicts one example of a non-linear I-V characteristic 1180 for a discrete re-writeable non-volatile two-terminal resistive memory element (e.g., 102, 400) having integral selectivity due to its non-linear I-V characteristics and the non-linear I-V characteristic is maintained regardless of the value of the data stored in the memory cell, that is the I-V characteristic of the memory element does not change from non-linear to linear as a function of the resistive state stored in the memory element. Therefore, the non-linear I-V characteristic of the memory element is non-linear for all values of stored data (e.g., resistive states). Voltage V applied across the memory element is plotted on the Y-axis and current density J through the memory element is plotted on the X-axis. Here, current through the memory element is a non-linear function of the applied voltage across the memory element. Accordingly, when voltages for data operations (e.g., read and write voltages) are applied across the memory element, current flow through the memory element does not significantly increase until after a voltage magnitude of about 2.0V (e.g., at ≈0.2 A/cm$^2$) is reached (e.g., a read voltage of about 2.0V across the memory element). An approximate doubling of the voltage magnitude to about 4.0V does not double the current flow and results in a current flow of ≈0.3 A/cm$^2$. The graph depicted is only an example and actual non-linear I-V characteristics will be application dependent and will depend on factors including but not limited to an area of the memory element (e.g., area determines the current density J) and the thin-film materials used in the memory element, just to name a few. The area of the memory element will be application dependent. Here, the non-linear I-V characteristic of the discrete memory element applies to both positive and negative values of applied voltage as depicted by the non-linear I-V curves in the two quadrants of the non-linear I-V characteristic 1180.

One advantage of a discrete re-writeable non-volatile two-terminal resistive memory element (e.g., 102, 400) that has integral selectivity due to a non-linear I-V characteristic is that when the memory element is half-selected (e.g., one-half of the magnitude of a read voltage or a write voltage is applied across the memory element) during a data operation to a selected memory cell(s), the non-linear I-V characteristic is operative as an integral quasi-selection device and current flow through the memory element is reduced compared to a memory cell with a linear I-V characteristic. Therefore, a non-linear I-V characteristic can reduce data disturbs to the value of the resistive state stored in the memory element when the memory element is un-selected or is half-selected. Here, a discrete re-writeable non-volatile two-terminal resistive memory element (e.g., 102, 400) is directly electrically in series with its respective terminals/electrodes and with its respective WL and BL and does not include a non-ohmic device or selection device such as a diode, a pair of diodes (e.g., in a back-to-back configuration), a transistor, a MIM or MIIM device, or any other type of device. A discrete re-writeable non-volatile two-terminal resistive memory element (e.g., 102, 400) as exactly two-terminals (e.g., the electrode pairs 406/408 or 407/409). Furthermore, the exclusion of a non-ohmic device or selection device eliminates the voltage drop across the non-ohmic device or selection device such that the voltages for data operations can be reduce because the only voltage drop is across the discrete memory element itself. Sans the non-ohmic device or selection device, charge pumps for generating large positive and negative voltages for data operations can be eliminated or at least significantly reduced in size due to lower voltage requirements that obtain when non-ohmic device or selection devices are eliminated from the memory element. Reduction in size or outright elimination of charge pumps can reduce the power signature of an IC, reduce die size, conserve battery power, and reduce battery size, just to name a few advantages.

In some embodiments, the cross-point arrays described herein and their associated WLs, BLs, and memory elements can be configured into arrays with local bit lines LBLs and/or global bit lines GBLs and their associated FEOL pass transistors and gain stage transistors as described in Pending U.S. patent application Ser. No. 13/134,589, filed on Jun. 10, 2011 and titled "Array Voltage Regulating Technique To Enable Data Operations On Large Cross-Point Memory Arrays With Resistive Memory Elements" and in Pending U.S. patent application Ser. No. 13/134,579, filed on Jun. 10, 2011 and titled "Memory Array With Local Bitlines And Local-To-Global Bitline Pass Gates And Gain Stages", both of which are hereby incorporated by reference in their entirety for all purposes.

Figure 12:
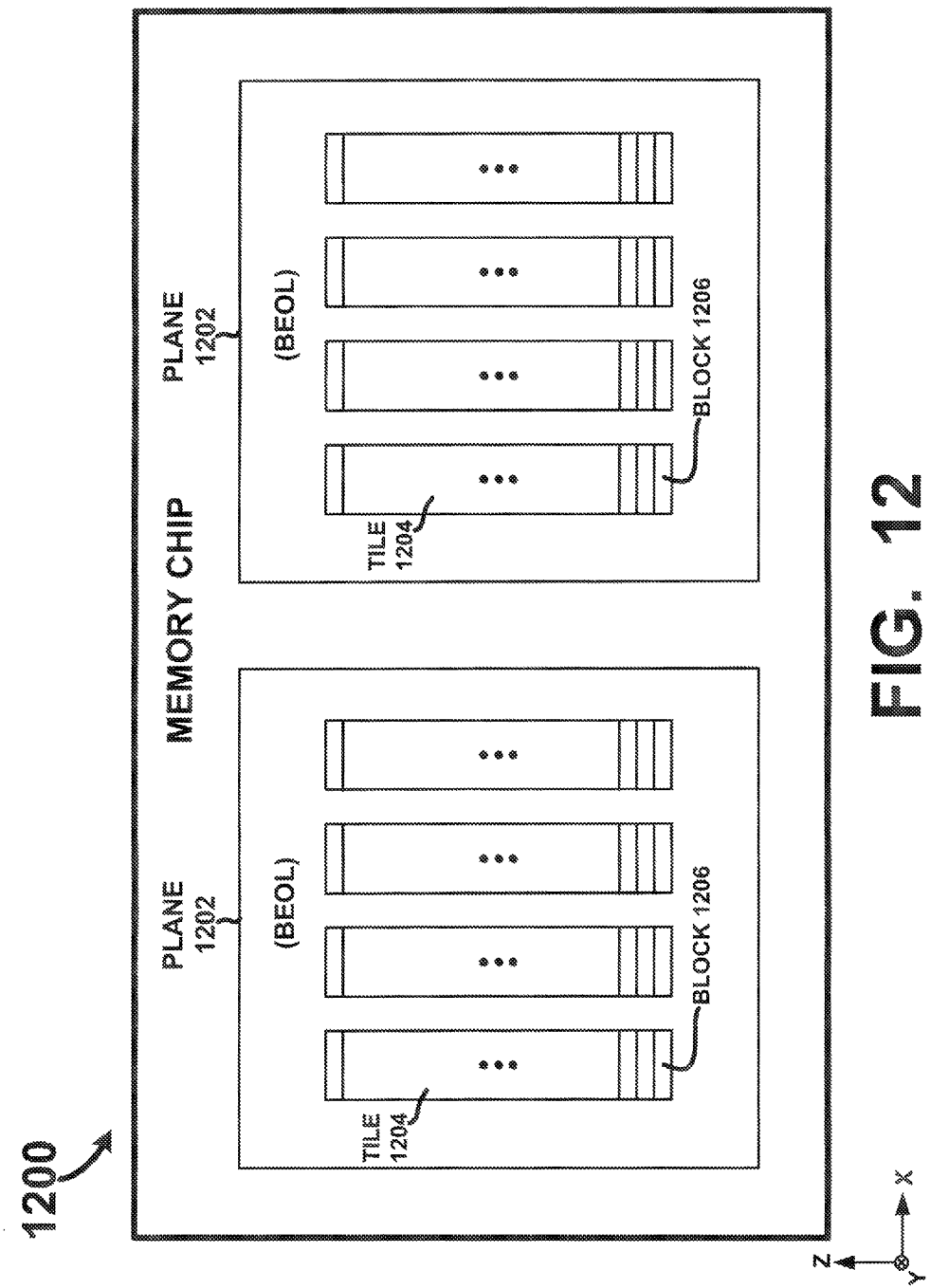
FIG. 12 is a plan view drawing depicting one example of a memory chip, according to an embodiment of the present invention.

FIG. 12 is a plan view drawing depicting an exemplary memory chip 1200, according to an embodiment of the present invention. The memory chip 1200 can be implemented as an IC on a silicon die (e.g., die 1199 of FIG. 11B) in which the circuitry portion is fabricated FEOL on the die followed by the memory portion fabricated BEOL on the same die. The memory chip 1200 includes one or more BEOL memory planes 1202, each memory plane 1202 including one or more tiles 1204 having one or more memory blocks 1206. The memory blocks 1206 each comprise an independent and separately accessible multi-layer two-terminal cross-point memory array, like or similar to one of the multi-layer two-terminal cross-point memory arrays described above, and each memory block 1206 includes one or more erase blocks or at least a portion of an erase block.

Figure 13:
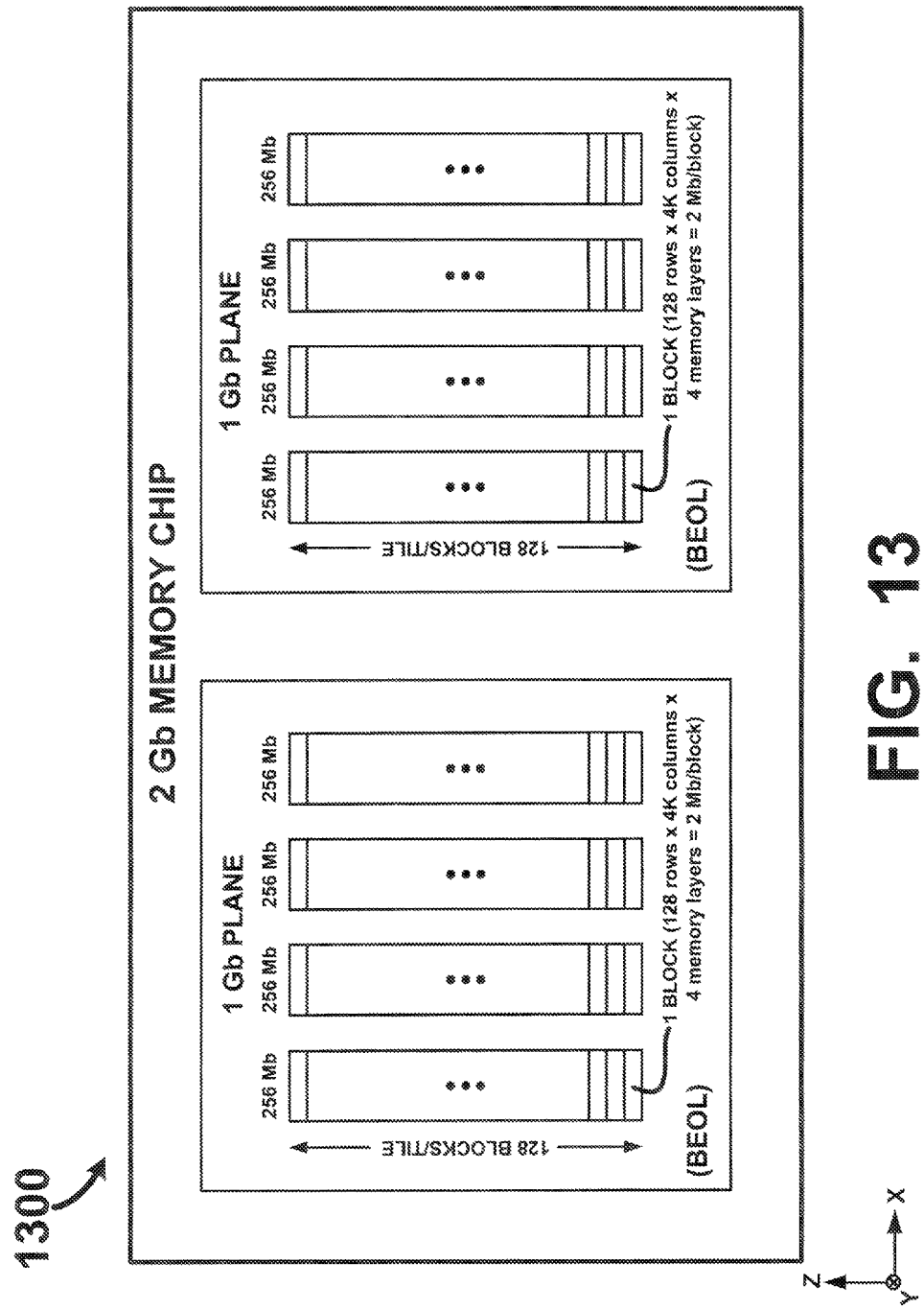
FIG. 13 is a plan view drawing depicting another example of a memory chip, according to an embodiment of the present invention.

FIG. 13 is a drawing depicting one exemplary implementation of a 2 Gb memory chip 1300 that has been manufactured according to the delineations depicted FIG. 12. The memory chip 1300 can be implemented as an IC on a silicon die in which the circuitry portion is fabricated FEOL on the die followed by the memory portion fabricated BEOL on the same die. The 2 Gb memory chip 1300 comprises two 1 Gb planes. Each plane includes four 256 Mb tiles, each tile having 128 blocks. Each memory block comprises an independent and separately accessible memory array, like or similar to one of the multi-layer cross-point memory arrays shown and described above. Finally, each memory block has four memory layers, 128 rows (i.e., WLs or X lines) and 4K (i.e., four thousand) columns (i.e., BLs or Y lines), for a total of 2 Mb per block.

Figure 14:
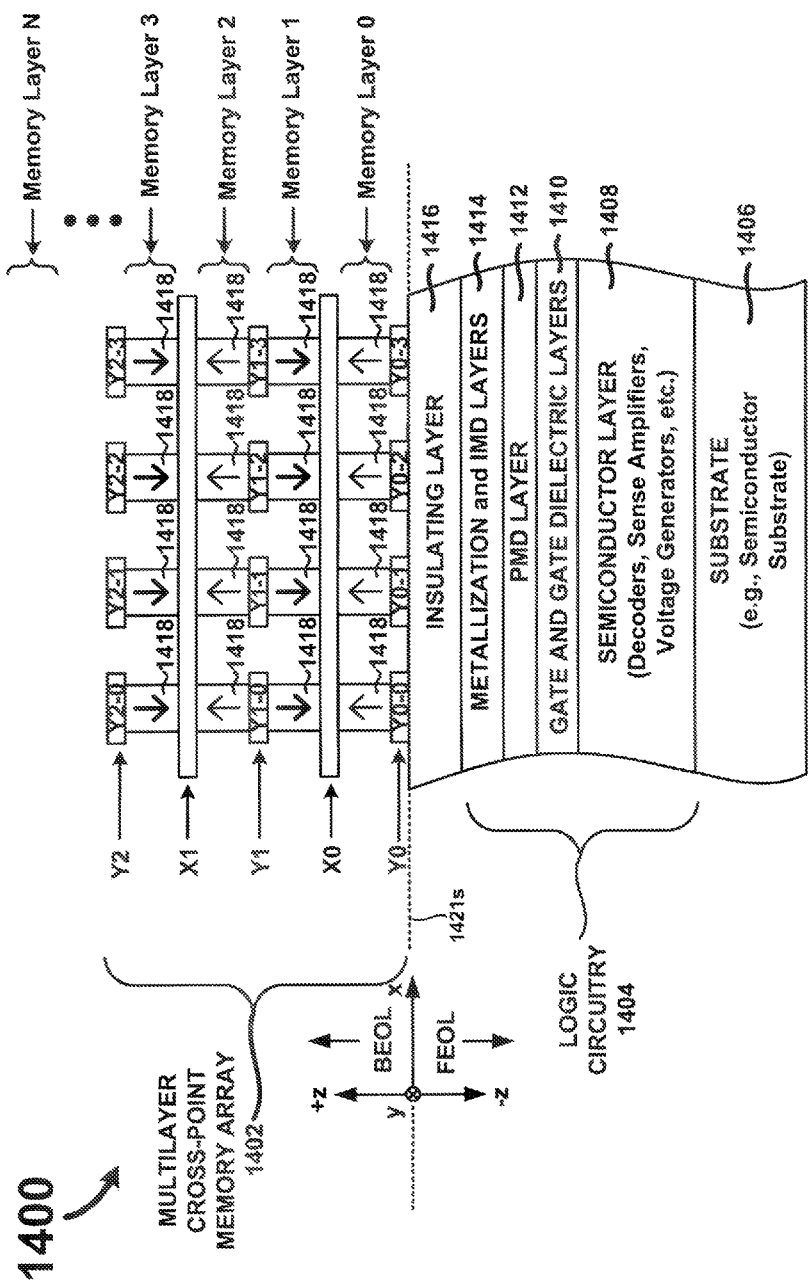
FIG. 14 is a cross-sectional drawing depicting a memory structure including logic circuitry manufactured according to a front-end-of-the-line (FEOL) semiconductor manufacturing process and an overlying multi-layer cross-point memory array including inverted and non-inverted memory elements that are manufactured according to a back-end-of-the-line (BEOL) manufacturing process, according to an embodiment of the present invention.

According to one embodiment of the invention, the multi-layer cross-point memory arrays of the present invention are fabricated in a back-end-of-the-line (BEOL) manufacturing process, following a front-end-of-the-line (FEOL) semiconductor manufacturing process during which the logic circuitry (e.g., the address decoders, sense amplifiers, voltage generators, etc.) used to control the memory arrays are fabricated (e.g., on a silicon wafer or die). FIG. 14 depicts a cross-section of a completed memory structure 1400 that has been fabricated according to this embodiment of the invention. The FEOL process, which may comprise, for example, a complementary metal-oxide-semiconductor (CMOS) semiconductor manufacturing process, includes the following salient steps: (1) fabricating active devices (e.g., transistors and other CMOS circuitry) and other circuit elements of the logic circuitry 1404 in a layer 1408 (e.g., a semiconductor epitaxial layer) that has been grown on a substrate 1406 (or, alternatively, directly in a semiconductor substrate); (2) growing, patterning and etching gates and gate dielectric layers 1410 of the active devices above the semiconductor epitaxial layer 1408; (3) depositing a pre-metal dielectric (PMD) layer 1412 over the gate and gate dielectric layers 1410; (4) depositing, patterning and etching metallization and intra-metal dielectric (IMD) layers 1414 over the PMD layer 1412; and, (5) finally, forming a final insulating layer 1416 over the metallization and IMD layers 1414. Examples of CMOS fabrication processes that may be used to form the various FEOL layers of the memory structure 1400 may be found in R. Jacob Baker, "*CMOS Circuit Design, Layout and Simulation*," Revised Second Edition, IEEE Press, John Wiley & Sons, 2008, which is hereby incorporated by reference. Some or all of the fabrication processes for the BEOL memory layers and memory elements may be similar or identical to those used for fabricating the FEOL layers. Therefore, microelectronics fabrication processes and capital equipment (e.g., for sub-45 nm feature size processing) that are used for the FEOL processing may be used for the BEOL processing, thereby lowering production costs by utilizing the same tool sets for FEOL and BEOL processing. One skilled in the art will appreciated and understand that some BEOL processing steps may require bespoke processes and equipment to accomplish.

The WL, BL and memory layers of the multi-layer cross-point memory array 1402 are fabricated during the BEOL process, directly on top of the completed FEOL-fabricated portion of the memory structure 1400, using thin film deposition techniques, such as sputtering, ablation and/or evaporation. One significant benefit of forming the multi-layer cross-point memory array 1402 in the BEOL process is that it affords the ability to form all, substantially all, or a significant portion of the logic circuitry 1404 beneath the memory array 1402. This minimizes the required footprint of the memory structure 1400 and, therefore, allows more high-density memory chips to be fabricated per substrate. The alternating WL layers: X0 and X1, memory layers: Memory Layer 0, Memory Layer 1, Memory Layer 2 and Memory Layer 3, and BL layers: Y0, Y1 and Y2 are progressively formed along the +Z axis, starting with the BL layer Y0, and directly on top of the uppermost FEOL layer (e.g., directly on top of an upper planar surface 1421s of insulating layer 1416). As in the other memory arrays of the invention, the memory elements 1418 of the multi-layer cross-point memory array 1402 are fabricated such that they have opposing orientations in successive memory layers, as indicated by the up and down arrows in the memory elements 1418 (Note—the order of Y0, X0, Y1, X1, Y2 is interchangeable with X0, Y0, X1, Y1, X2 as will be appreciated by one of ordinary skill in the art).

Figure 15:
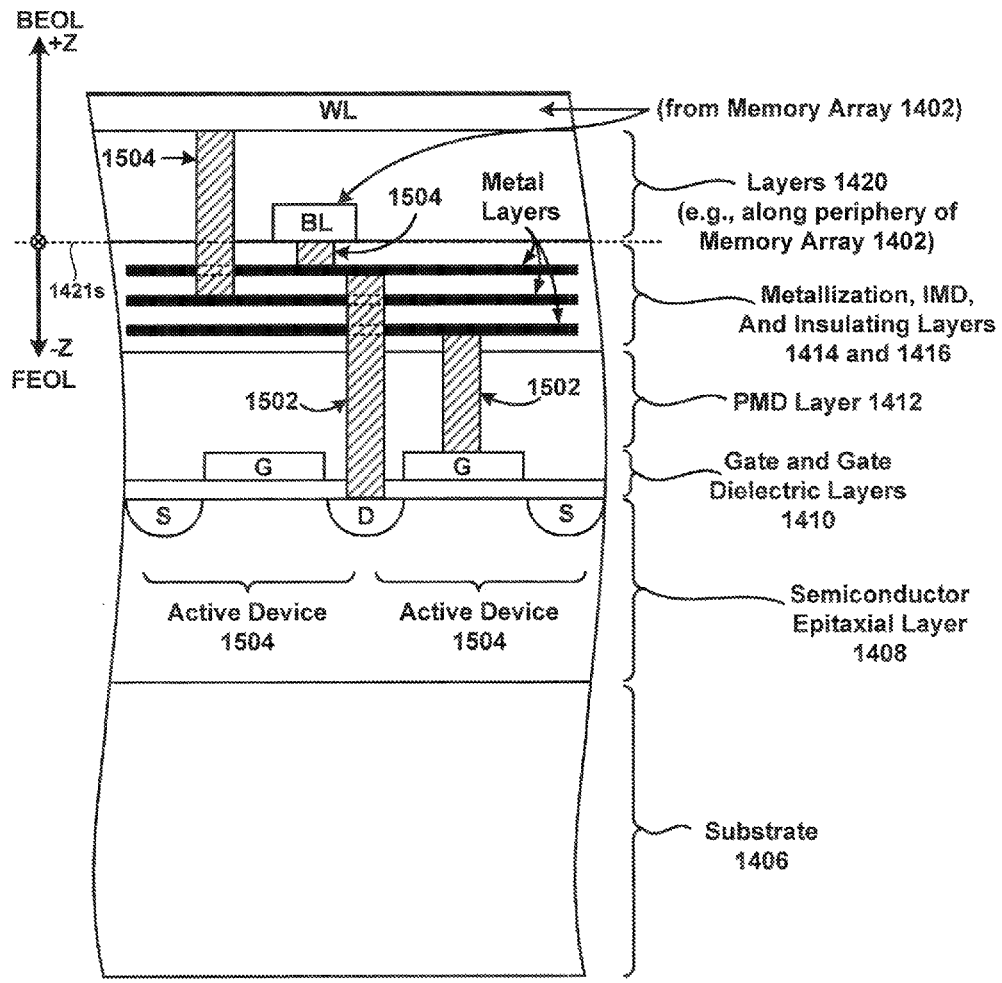
FIG. 15 is a cross-sectional drawing depicting how electrically conductive vias formed through various layers of the memory structure in FIG. 14 are used to electrically couple BEOL WLs and BLs of the multi-layer cross-point memory array with active devices (e.g., CMOS circuitry) in an underlying semiconductor substrate (e.g., Silicon wafer or die), within which the active devices of the logic circuitry are formed FEOL.

During the FEOL process, and as illustrated in FIG. 15, via openings are patterned, etched and filled with a conductive material (e.g., metal), to form conductive vias 1502 through the metallization, IMD, PMD and gate/gate dielectric layers 1410-1416. The conductive vias 1502 serve to complete the electrical interconnects between active devices 1504 and other circuit elements of the logic circuitry 1404. Additional conductive vias 1504 are formed during the BEOL process, specifically through via openings underneath and/or along the periphery of the memory array 1402 and through via openings formed through one or more layers of the metallization and IMD layers 1414. These additional conductive vias 1504 serve to electrically couple the WLs and BLs of the memory array 1402 to metal layers in the metallization and IMD layers 1414, and through conductive vias 1502 to the active devices 1504 in the semiconductor epitaxial layer 1408.

Any type of memory element having asymmetric disturb characteristics may be used and configured with alternating orientations in successive memory layers of the multi-layer cross-point memory array 1402, so as to benefit from the stress-voltage-relieving principles of the present invention. In one embodiment of the invention, the memory elements 1418 comprise CMO-based memory elements, like or similar to the CMO-based memory elements 400 described above in reference to FIGS. 4A-8. When CMO-based memory elements 400 are utilized, the various layers of the CMO-based memory elements, such as CMO and IMO layers 402 and 404, may be formed using sputtering, ablation, evaporation, physical vapor deposition (PVD), co-sputtering, atomic layer deposition (ALD), or other suitable thin-film deposition techniques. Regardless of the deposition technique employed, however, the order of forming the CMO and IMO layers 402 and 404 is reversed in the formation of each successive memory layer so that the orientations of CMO-based memory elements in successive memory layers of the resulting multi-layer cross-point memory array 1402 are oriented in opposing orientations.

Although the present invention has been described in detail with reference to certain preferred embodiments thereof, various changes in form and detail are possible. Therefore, the spirit and scope of the invention should not be limited to the description of the preferred versions contained herein, but instead should be construed in reference to the appended claims and conferred the full scope of equivalents to which such claims are entitled.

What is claimed is:

1. A non-Flash multi-layer memory array, comprising:
one or more back-en-of-the-line (BEOL) word line (WL) layers;
one or more BEOL bit line (BL) layers interleaved with the one or more WL layers; and
a plurality of BEOL memory layers, each memory layer disposed between an adjacent WL layer and an adjacent BL layer, and each memory layer including a plurality of discrete re-writeable non-volatile two-terminal memory elements configured between crossings of WLs and BLs of the adjacent WL and BL layers,
wherein the memory elements in adjacent memory layers are configured with opposing orientations.

2. The multi-layer memory array of claim 1, wherein each memory element comprises a resistive memory element that is configurable to two or more resistive states.

3. The multi-layer memory array of claim 1, wherein each memory element includes a non-linear I-V characteristic that is independent of a value of data stored in the memory element.

4. The multi-layer memory array of claim 1, wherein each memory element comprises a bipolar memory element.

5. The multi-layer memory array of claim 1, wherein each memory element includes asymmetric disturb characteristics.

6. The multi-layer memory array of claim 1, wherein each memory element comprises a conductive metal oxide based (CMO-based) memory element having a CMO layer including mobile oxygen ions, an insulating metal oxide (IMO) layer in contact with and electrically in series with the CMO layer, a first electrode coupled with the CMO layer, a second electrode coupled with the IMO layer, and the IMO layer having thickness that is less than 50 Angstroms.

7. The multi-layer memory array of claim 6, wherein the first electrodes of the CMO-based memory elements are coupled to the WLs of the one or more WL layers and the second electrodes of the CMO-based memory elements are coupled to the BLs of the one or more BL layers.

8. The multi-layer memory array of claim 6, wherein the first electrodes of the CMO-based memory elements are coupled to the BLs of the one or more BL layers and the second electrodes of the CMO-based memory elements are coupled to the WLs of the one or more WL layers.

9. The multi-layer memory array of claim 1, wherein a write operation to one or more of the memory elements does not require a prior erase operation.

10. The multi-layer memory array of claim 1, wherein each memory element retain stored data in the absence of electrical power.

11. The multi-layer memory array of claim 1, wherein the memory elements are individually addressable and readable on a bit basis.

12. The multi-layer memory array of claim 1, wherein the memory elements are individually addressable and programmable on a bit basis.

13. The multi-layer memory array of claim 1, wherein the memory elements are individually addressable and erasable on a bit basis.

14. The multi-layer memory array of claim 1, wherein two or more memory layers of the plurality of memory layers are configured in a common erase block.

15. A non-Flash non-volatile memory structure, comprising:
a multi-layer memory array including
one or more word line (WL) layers,
one or more bit line (BL) layers interleaved with the one or more WL layers,
a first memory layer having a plurality of non-inverted discrete re-writeable non-volatile two-terminal memory elements disposed between crossings of WLs of a first WL layer of the one or more WL layers and BLs of a first BL layer of the one or more BL layers, and
a second memory layer having a plurality of inverted discrete re-writeable non-volatile two-terminal memory elements disposed between crossings of WLs of the first WL layer and BLs of a second BL layer of the one or more BL layers or between BLs of the first BL layer and WLs of a second WL layer of the one or more WL layers; and
circuitry configured to perform data operations on the non-inverted memory elements and the inverted memory elements of the multi-layer memory array.

16. The memory structure of claim 15, wherein the non-inverted and inverted memory elements of the multi-layer memory array are oriented so that memory elements selected during the performing of data operations are subjected to stress voltages of a polarity of which they are least susceptible to being disturbed.

17. The memory structure of claim 15, wherein the inverted and non-inverted memory elements of the multi-layer memory array comprise resistive memory elements that are configurable to two or more resistive states.

18. The memory structure of claim 15, wherein a write operation to the inverted and non-inverted memory elements does not require a prior erase operation.

19. The memory structure of claim 15, wherein the inverted and non-inverted memory elements of the multi-layer memory array comprise bipolar memory elements.

20. The memory structure of claim 15, wherein the inverted and non-inverted memory elements of the multi-layer memory array comprise memory elements having asymmetric disturb characteristics.

21. The memory structure of claim 15, wherein the inverted and non-inverted memory elements of the multi-layer memory array comprise a conductive metal oxide based (CMO-based) memory element having a CMO layer including mobile oxygen ions, an insulating metal oxide (IMO) layer in contact with and electrically in series with the CMO layer, a first electrode coupled with the CMO layer, a second electrode coupled with the IMO layer, and the IMO layer having thickness that is less than 50 Angstroms.

22. The memory structure of claim 21, wherein the first electrodes of the inverted and non-inverted CMO-based memory elements of the multi-layer memory array are coupled to the WLs of the one or more WL layers and the second electrodes of the inverted and non-inverted CMO-based memory elements are coupled to the BLs of the one or more BL layers.

23. The memory structure of claim 21, wherein the first electrodes of the inverted and non-inverted CMO-based memory elements of the multi-layer memory array are coupled to the BLs of the one or more BL layers and the second electrodes of the inverted and non-inverted CMO-based memory elements are coupled to the WLs of the one or more WL layers.

24. The memory structure of claim 15, wherein the inverted and non-inverted memory elements of the multi-layer memory array are non-volatile.

25. The memory structure of claim 15, wherein the inverted and non-inverted memory elements of the multi-layer memory array are re-writable.

26. The memory structure of claim 15, wherein the inverted and non-inverted memory elements of the multi-layer memory array are individually addressable and readable on a bit basis.

27. The memory structure of claim 15, wherein the inverted and non-inverted memory elements of the multi-layer memory array are individually addressable and programmable on a bit basis.

28. The memory structure of claim 15, wherein the inverted and non-inverted memory elements of the multi-layer memory array are individually addressable and erasable on a bit basis.

29. The memory structure of claim 15, wherein the first and second memory layers comprise inverted and non-inverted memory elements of a common erase block.

30. The memory structure of claim 15, wherein the logic circuitry is formed in a semiconductor layer, the multi-layer memory array is formed directly above and in contact with the semiconductor layer, and the WLs and BLs of the multi-layer memory array are electrically coupled with the circuitry by way of conductive vias and metallization layers disposed between the semiconductor layer and the multi-layer memory array.

31. The memory structure of claim 15, wherein the first, second, third, and fourth memory layers comprise inverted and non-inverted memory elements of a common erase block.

32. The memory structure of claim 15, wherein the circuitry is fabricated front-end-of-the-line (FEOL) on a silicon substrate and the multi-layer memory array is vertically fabricated back-end-of-the-line (BEOL) directly above and in direct contact with the silicon substrate.

33. A method of manufacturing a non-Flash non-volatile memory array, comprising:
   forming a first conductive layer having a plurality of word lines (WLs) or bit lines (BLs);
   forming a first memory layer having a plurality of non-inverted memory elements over the first conductive layer, each non-inverted memory element of the plurality of non-inverted memory elements having a first terminal electrically coupled to the WLs or BLs of the first conductive layer;
   forming a second conductive layer having a plurality of WLs or BLs over the first memory layer so that second terminals of the non-inverted memory elements of the plurality of non-inverted memory elements are electrically coupled to the WLs or BLs of the second conductive layer;
   forming a second memory layer having a plurality of inverted memory elements over the second conductive layer, each inverted memory element of the plurality of inverted memory elements having a first terminal electrically coupled to the WLs or BLs of the second conductive layer; and
   forming a third conductive layer having a plurality of WLs or BLs over the second memory layer so that second terminals of the inverted memory elements of the plurality of inverted memory elements are electrically coupled to the WLs or BLs of the third conductive layer.

34. The method of claim 33, wherein all the forming occurs as part of a back-end-of-the-line (BEOL) fabrication process that vertically fabricates memory directly above a silicon substrate, the silicon substrate including
   an interconnect structure, and
   circuitry configured to perform data operations on one or more of the plurality of inverted and non-inverted memory elements,
   the circuitry and interconnect structure are fabricated as part of a front-end-of-the-line (FEOL) fabrication process,
   the interconnect structure operative to electrically couple the plurality of WLs or BLs with at least a portion of the circuitry, and
   the BEOL fabrication process occurs after the FEOL fabrication process.

* * * * *